United States Patent [19]

Goel et al.

[11] Patent Number: 4,494,066
[45] Date of Patent: Jan. 15, 1985

[54] METHOD OF ELECTRICALLY TESTING A PACKAGING STRUCTURE HAVING N INTERCONNECTED INTEGRATED CIRCUIT CHIPS

[75] Inventors: Prabhakar Goel; Maurice T. McMahon, both of Poughkeepsie, N.Y.

[73] Assignee: International Business Machines Corporation, Armonk, N.Y.

[21] Appl. No.: 518,580

[22] Filed: Jul. 29, 1983

Related U.S. Application Data

[62] Division of Ser. No. 280,050, Jul. 2, 1981, Pat. No. 4,441,075.

[51] Int. Cl.³ .................. G01R 31/28; G06F 11/00
[52] U.S. Cl. .................................................. 324/73 R
[58] Field of Search ............ 324/73 R, 73 AT, 158 R; 364/580; 371/15

[56] References Cited

U.S. PATENT DOCUMENTS

| 3,789,205 | 1/1974 | James | 324/73 R X |
| 4,183,460 | 1/1980 | Yuen et al. | 324/73 R X |
| 4,220,917 | 9/1980 | McMahon | 324/73 R |
| 4,241,307 | 12/1980 | Hong | 324/73 R |
| 4,395,767 | 7/1983 | Van Brunt et al. | 324/73 R X |

Primary Examiner—Gerard R. Strecker
Attorney, Agent, or Firm—Wesley DeBruin

[57] ABSTRACT

Design rules and test structure are used to implement machine designs to thereby obviate during testing the need for mechanical probing of the chip, multichip module, card or board at a higher level of package. The design rules and test structure also provide a means of restricting the size of logic partitions on large logical structures to facilitate test pattern generation. A test mechanism is available on every chip to be packaged to drive test data on all chip outputs and observe test data on all chip inputs, independent of the logic function performed by the chip. A control mechanism is also provided to allow a chip to either perform its intended function or to act as a testing mechanism during package test. It is intended that the test mechanism built into every chip will be used in place of mechanical probes to perform a chip-in-place test and interchip wiring test of the package. The intent of the design rules is to design chips such that each chip can be "isolated" for testing purposes through the pins (or other contacts) of a higher level package containing such chips. It is also required that the "Level Sensitive Scan Design" (LSSD) discipline, or rules, be followed for each chip and for the package clock distribution network. Further, the LSSD Rules which ensures the capability of scanning data into and out of the package SRLs (shift register latches) must be satisfied for the total package.

2 Claims, 43 Drawing Figures

MODULE WITH ECIPT MECHANISM
(MODULE MAY CONTAIN 100 CHIPS OR MORE)

SYMBOLIC REPRESENTATION OF SHIFT REGISTER LATCH (SRL)

IMPLEMENTATION OF SRL OF FIG. 1 IN AND-INVERT GATES

CHIP WITH THREE INTERCONNECTED SRL'S

FOUR CHIPS ON MODULE WITH INTERCONNECTED SRL'S

EXAMPLE OF AN SRL WHERE THE LATCH L2 HAS A
TEST DATA PORT (TEST-SRL OR TSRL)

TEST-SRL OR TSRL OF FIG.5 IMPLEMENTED IN
AND-INVERT GATES

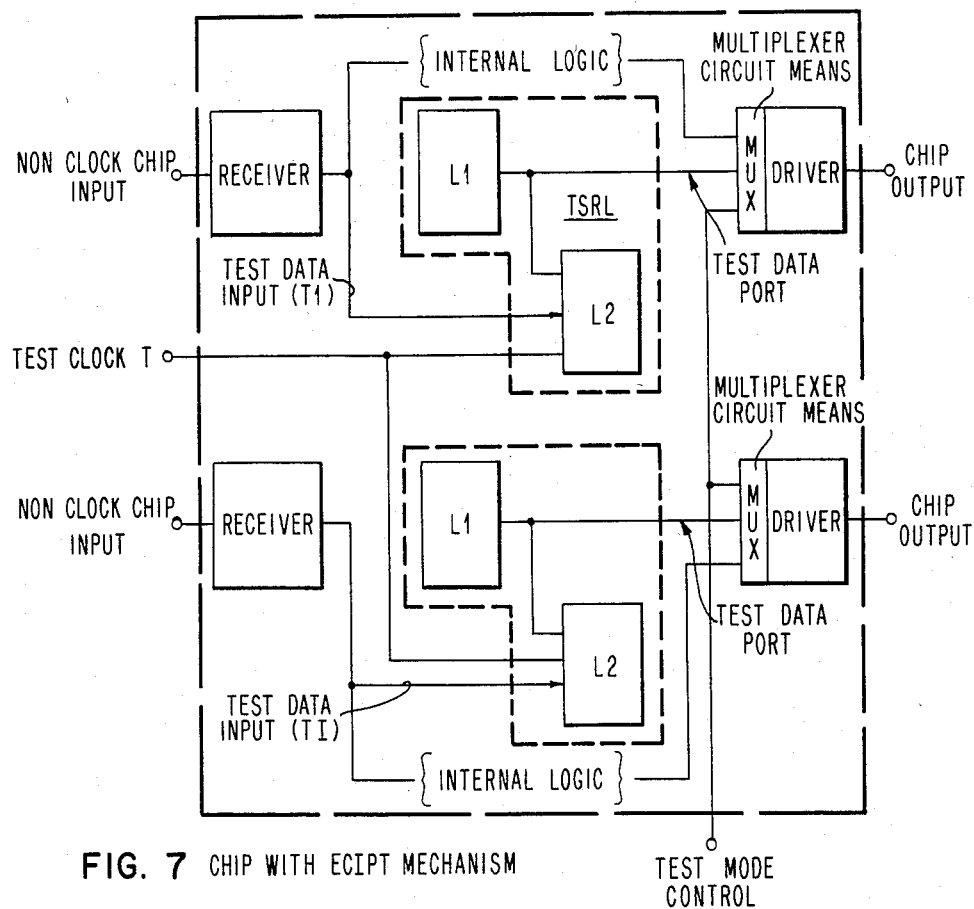
FIG. 7 CHIP WITH ECIPT MECHANISM
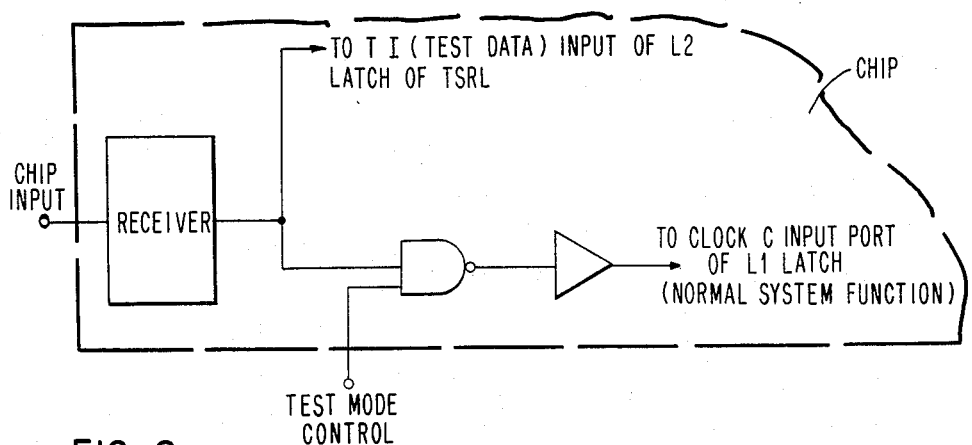
FIG. 8 (WHERE CHIP IS USED AS PART OF THE LSSD SYSTEM CLOCKING MECHANISM FOR THAT CHIP)

(WHERE CHIP OUTPUT IS USED AS PART OF THE PACKAGE LSSD CLOCK DISTRIBUTION NETWORK)

MODULE WITH ECIPT MECHANISM
(MODULE MAY CONTAIN 100 CHIPS OR MORE)

ALL CHIPS IN TEST MODE

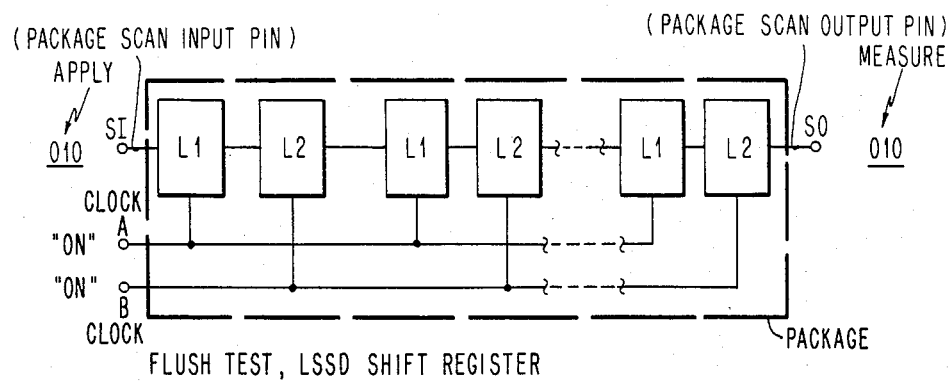
FIG. 13 FLUSH TEST, LSSD SHIFT REGISTER
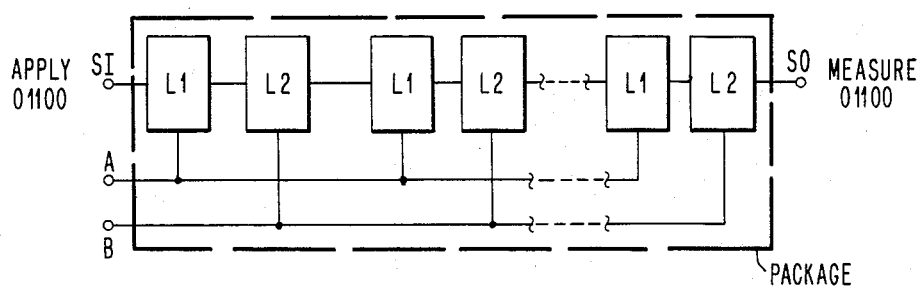
FIG. 14 SHIFT TEST, LSSD SHIFT REGISTER
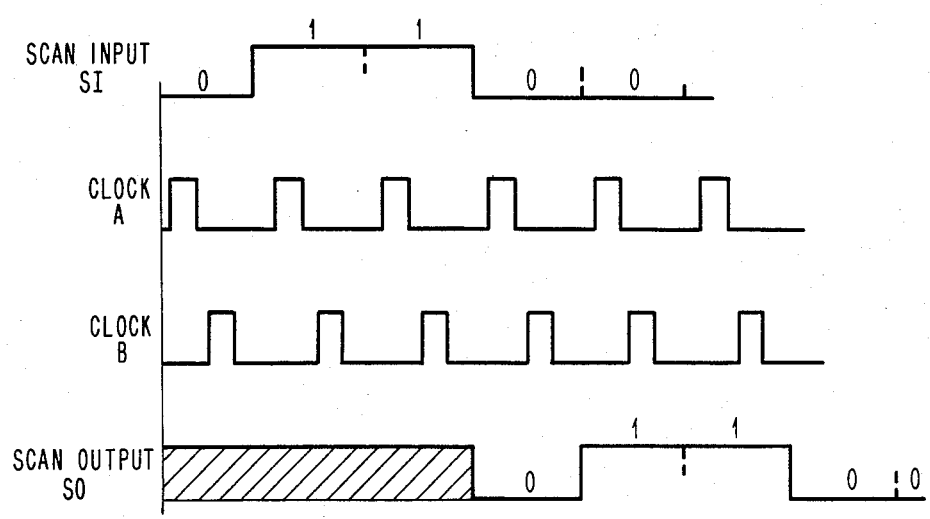
FIG. 15 "SHIFT TEST" WAVEFORMS FOR SHIFT REGISTER OF FIG. 14

ALL CHIPS IN TEST MODE (PACKAGE WIRING TEST)
NOTE: LSSD SHIFT REGISTER CONNECTIONS, A+B CLOCKS AND TEST MODE CONTROLS NOT SHOWN.

T CLOCK - APPLIED IN BOTH TEST 1 AND TEST 2
ALL CHIPS IN TEST MODE (PACKAGE WIRING TEST WITH NO DOTTING OF CHIP OUTPUTS)

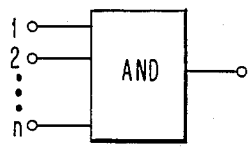
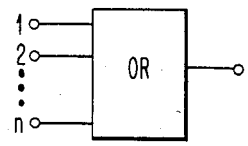
| TEST # | INPUTS | | | | | OUTPUTS |
|---|---|---|---|---|---|---|
| | 1 | 2 | 3 | – | n-1 | n | |
| 1 | 0 | 1 | 1 | | 1 | 1 | 0 |
| 2 | 1 | 0 | 1 | | 1 | 1 | 0 |
| 3 | 1 | 1 | 0 | | 1 | 1 | 0 |
| – | – | – | – | | – | – | – |
| – | – | – | – | | – | – | – |
| – | – | – | – | | – | – | – |
| n | 1 | 1 | 1 | | 1 | 0 | 0 |
| n+1 | 1 | 1 | 1 | | 1 | 1 | 1 |
AND, n-INPUT SEQUENCE
FIG. 18
| TEST # | INPUTS | | | | | OUTPUTS |
|---|---|---|---|---|---|---|
| | 1 | 2 | 3 | – | n-1 | n | |
| 1 | 1 | 0 | 0 | | 0 | 0 | 1 |
| 2 | 0 | 1 | 0 | | – | 0 | 1 |
| 3 | 0 | 0 | 1 | | – | 0 | 1 |
| – | – | – | – | | – | – | – |
| – | – | – | – | | – | – | – |
| – | – | – | – | | – | – | – |
| n | 0 | 0 | 0 | | – | 1 | 1 |
| n+1 | 0 | 0 | 0 | | – | 0 | 0 |
OR, n-INPUT SEQUENCE
FIG. 19
TEST COMBINATIONS FOR DOT CONFIGURATIONS
| | TEST # | 1 | 2 | 3 | 4 | |
|---|---|---|---|---|---|---|
| INPUTS | a | 0 | 1 | 1 | 1 | g } n=3 |
| | b | 1 | 0 | 1 | 1 | |
| | c | 1 | 1 | 0 | 1 | |
| | d | 0 | 1 | 1 | X | h } n=2 |
| | e | 1 | 0 | 1 | X | |
| | f | 0 | 1 | X | X | i – n=1 |
n=1, n=2, n=3 DOT CONFIGURATIONS
| | TEST # | 1 | 2 | 3 | 4 |
|---|---|---|---|---|---|
| OUTPUTS | g | 0 | 0 | 0 | 1 |
| | h | 0 | 0 | 1 | X |
| | i | 0 | 1 | X | X |
DOT AND FUNCTION
FIG. 20

PACKAGE WIRING TEST
(THREE TESTS NEEDED SINCE AT MOST TWO
CHIP OUTPUTS ARE DOTTED TOGETHER)

PACKAGE WIRING TEST (DIAGNOSTIC RESOLUTION)

(THE PORTIONS 1 THROUGH 6 OF THE PACKAGE NET ARE
INDEPENDENTLY DIAGNOSABLE BASED ON OBSERVED VALUES
AT THE PACKAGE OUTPUT PIN AND THE FOUR L2 LATCHES)

PACKAGE WIRING TEST (DIAGNOSTIC RESOLUTION WITH DOTTING)
FAILURE ON THE THREE TEST SEQUENCE RESULTS IN
DIAGNOSING: PORTION a STUCK AT "1"; PORTION b STUCK AT "1";
PORTION c STUCK AT "0".

PACKAGE WIRING TEST (DIAGNOSTIC RESOLUTION)
PACKAGE SHORT DETECTION.

CUT DEFINITIONS - CHIP INPUT NETS

CUT DEFINITIONS - CHIP OUTPUT NETS

TEST PATH SELECTED AT MUX WHEN CHIP IS IN TEST MODE, WHERE "MUX" IS A MULTIPLEXER CIRCUIT

CUT ENVIRONMENT - CLOCK NETS

CUT ENVIRONMENT – CLOCK NETS

CUT ENVIRONMENT – CLOCK NETS

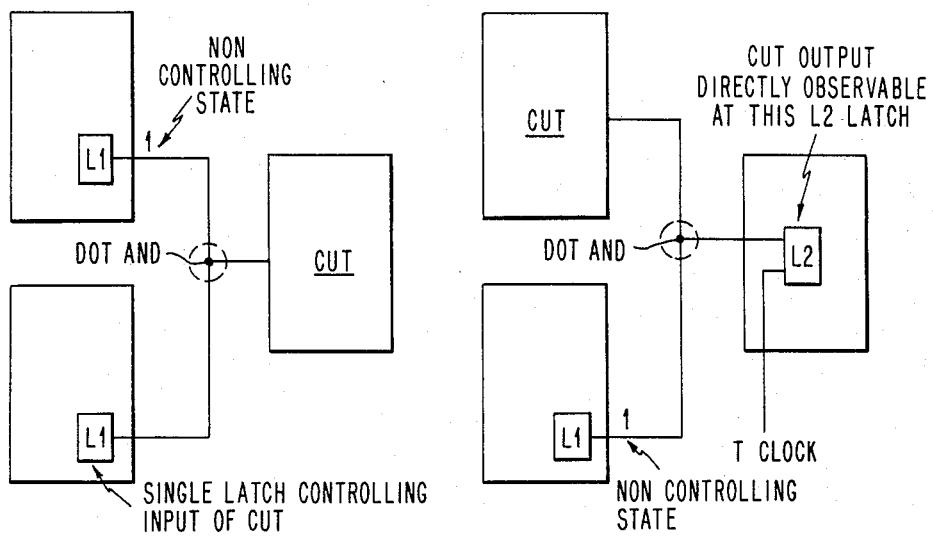

CUT ENVIRONMENT, WHERE A CUT NON-CLOCK
INPUT IS CONNECTED TO A PACKAGE NET
CONTROLLED BY MORE THAN ONE
SHIFT REGISTER LATCH. FIG. 32

CUT ENVIRONMENT, WHERE A CUT OUTPUT
IS CONNECTED TO A PACKAGE NET
WHICH IS ALSO CONNECTED TO OUTPUTS
FROM OTHER CHIPS. FIG. 33

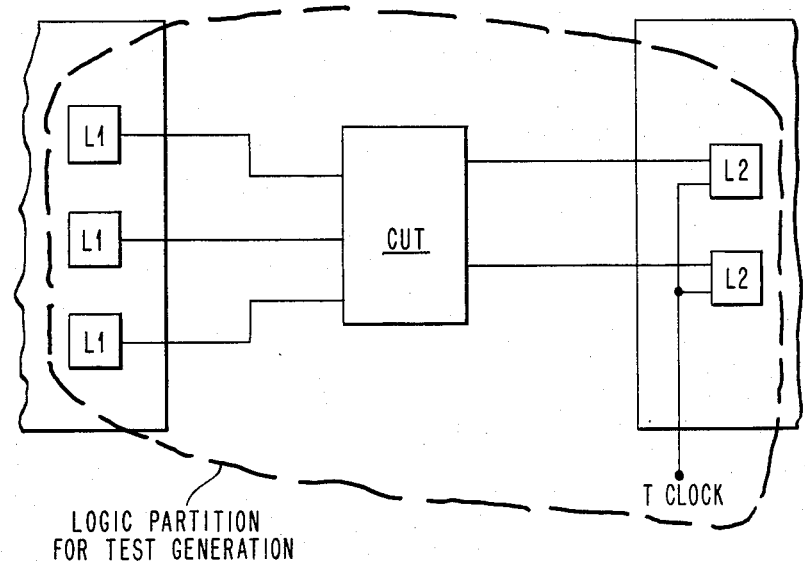

CUT ENVIRONMENT – CUT WITH THE SURROUNDING CONNECTED SHIFT REGISTER
LATCHES AND THOSE PACKAGE PINS THAT CONTROL THE CUT CLOCK INPUTS
TREATED AS A LOGIC PARTITION.

FIG. 34

CUT ENVIRONMENT,
TEST APPLICATION – MIGRATION TEST

CUT ENVIRONMENT
TEST APPLICATION – MIGRATION TEST

CUT ENVIRONMENT, TEST APPLICATION — MIGRATION TEST

CUT ENVIRONMENT, TEST APPLICATION — MIGRATION TEST

ECIPT STRUCTURE FOR LOGIC CONNECTIVE
SHOWN INSIDE DASHED LINES

SINGLE CUSTOMIZED MACRO INTEGRATING OCD, MUX, AND TSRL TO OBTAIN ECIPT STRUCTURE DEPICTED IN FIG. 40.

METHOD OF ELECTRICALLY TESTING A PACKAGING STRUCTURE HAVING N INTERCONNECTED INTEGRATED CIRCUIT CHIPS

This is a division of application Ser. No. 280,050, filed July 2, 1981 and granted as U.S. Pat. No. 4,441,075 on Apr. 3, 1984.

FIELD OF THE INVENTION

The invention relates to the testing of integrated circuit chips, multi-chip modules, card, boards, etc., more generally, the invention relates to and has particular utility in the testing of electronic packaging structures having high circuit density and a very large number of inaccessible circuit nodes.

CROSS-REFERENCE TO RELATED APPLICATIONS

1. U.S. patent application Ser. No. 066,130 entitled "Improved Level Sensitive Scan Design System", filed Aug. 13, 1979 by S. Das Gupta et al., and of common assignee with the subject application, granted as U.S. Pat. No. 4,293,919 on Oct. 6, 1981.
2. U.S. patent application Ser. No. 062,932 entitled "Method and Arrangement of Testing Sequential Circuits Represented by Monolithically Integrated Semiconductor Circuits", filed July 26, 1979 by J. Hajdu and G. Knauft and of common assignee with subject application, granted as U.S. Pat. No. 4,298,980 on Nov. 3, 1981.
3. U.S. Pat. No. 4,241,307 entitled "Module Interconnection Testing Scheme", filed Aug. 18, 1978 by Se June Hong, and of common assignee with the subject application, granted Dec. 23, 1980.
4. U.S. patent application Ser. No. 974,641 entitled "Testing Scheme For Logic Chips" filed Dec. 29, 1978 by F. F. Tsui and of common assignee with the subject application, granted as U.S. Pat. No. 4,244,048 on Jan. 6, 1981.
5. U.S. patent application Ser. No. 929,480 entitled "Test Circuitry For Module Interconnection Network" filed July 31, 1978, by M. T. McMahon, Jr., and of common assignee, granted as U.S. Pat. No. 4,220,917 on Sept. 2, 1980.
6. U.S. patent application Ser. No. 104,481, entitled "Module Testing On Testers With Insufficient Channels" filed Dec. 17, 1979 by H. D. Schnurmann and of common assignee, granted as U.S. Pat. No. 4,348,759 on Sept. 7, 1982. [The disclosures of (1) U.S. Pat. No. 3,761,695 entitled "Method of Level Sensitive Testing A Functional Logic System" granted Sept. 25, 1973 to E. B. Eichelberger, (2) U.S. Pat. No. 3,783,254 entitled "Level Sensitive Logic System" granted Jan. 1, 1974 to E. B. Eichelberger, (3) U.S. Pat. No. 3,784,907 entitled "Method of Propagation Delay Testing A Functional Logic System" granted Jan. 8, 1974 to E. B. Eichelberger, and (4) the publication "A Logic Design Structure For LSI Testability" by E. B. Eichelberger and T. W. Williams, 14th Design Automation Conference Proceedings, pages 462-8, June 20, 21, and 22, 1977, New Orleans, La., IEEE Catalog Number 77, CH 1216-1C are respectively incorporated herein to the same full and complete extent as though the text and drawings of said patents and publication were expressly fully set-forth herein].

BACKGROUND AND DESCRIPTION OF PRIOR ART

Several patents and publications identified in the "Background Art" section hereof further disclose Level Sensitive Scan Design (LSSD) methods and discipline that address the afore-recited needs. With the exception of a limited number of patents directed to packaging all the patents come under the generic title LSSD or are closely related thereto. A common thrust of the LSSD discipline is to prescribe a built-in capability for every LSI unit, such as chip module etc., whereby the entire logic state of the unit, under test, can be explicitly set and/or examined through exercising certain input/output (I/O) procedures at a limited number of I/O terminals. This requirement is implementable by imparting a shift register capability to every one of the logic system latches in the unit and thereupon organizing these shift register latches (SRL's) into one or more shift register data channels with their terminal stages accessible to the outside world. Further information and details of operation using the SRL facility of LSSD are given in a number of prior art patents and publications fully identified in the "Background Art" section set forth hereinafter. [Reference may be made to the following U.S. Pat. Nos. 3,784,254 entitled "Level Sensitive Logic System" granted Jan. 1, 1974 to E. B. Eichelberger; 3,761,695 entitled "Method of Level Sensitive Testing A Functional Logic System" granted Sept. 25, 1973 to E. B. Eichelberger; and 3,784,907 entitled "Method of Propagation Delay Testing A Functional Logic System" granted Jan. 8, 1974 to E. B. Eichelberger]. Stated very briefly, the LSSD approach comprises a test operation wherein certain desired logic test patterns are serially inputted and shifted to the appropriate latch locations when the unit is operated in the "shift mode" (i.e., by withholding the system clock excitations and turning on the shifting clock to the unit). When this is done, the latch states will provide the desired stimuli for the testing of the related logic nets. Now, propagate the test patterns through the nets by executing one or more steps of the "Function Mode" operation (i.e., by exercising one or more system clock excitations). The response pattern of the logic networks to the applied stimuli is now captured by the system latches, in a known manner depending on certain details of hardware design, often replacing the original inputted test patterns. Then, the system reverts to the shift-mode operation, outputting the response patterns for examination and comparison with standard patterns which should be present if the circuitry has operated properly.

In accordance with the prior art teaching, the testing of each chip contained in a high circuit density packaging structure (without disconnecting the chip to be tested from the high circuit density packaging structure, i.e., interconnecting circuitry and other chips) required an array of precisely positioned exposed contact pads for each chip contained and interconnected in the high circuit density packaging structure. The array of precisely positioned exposed contact pads for each chip was utilized by a mechanical test probe head in the testing of the chip subsequent to interconnection of the chip in the high circuit density packaging structure. The array of precisely positioned exposed contact pads (also termed "Engineering Change Pads") for each chip and interconnected in the packaging structure, as known in the art, are also available for engineering change purposes.

This method of testing has the disadvantage of requiring the alignment and subsequent stepping of the probe over the surface of the package—a time consuming process. Since the probe head contacts one chip site at a time, the connections between the chips on the package are not tested.

U.S. Pat. No. 4,220,917 discloses a plurality of interconnected integrated circuit chips each having an array of engineering pads for contact by a test probe and also for engineering change purposes. (U.S. Pat. No. 4,220,917 entitled "Test Circuitry For Module Interconnection Network" granted Sept. 2, 1980 to M. T. McMahon, Jr., and of common assignee herewith).

In accordance with the prior art teaching, an alternate approach to testing circuitry on a high density packaging structure requires through the package-pins test. The LSSD technique is employed to design the component chips of the package as well as to design the inter-chip connections on the package. Automatic test generation for dense LSSD logic structures employs the partitioning technique described in "Test Generation For Large Logic Networks" by P. S. Bottoroff, R. E. France, N. H. Garges and E. J. Orosz, 14th Design Automation Conference Proceedings, June 20, 21 and 22, 1977, New Orleans, La., IEEE Catalog Number 77, CH 1216-1C, pages 479 to 485. The technique logically partitions the dense LSSD logic into portions which are bounded on the inputs and outputs by SRL's and package pins. Tests are then generated individually for each partition and subsequently applied through the pins of the package at the tester. The limitations of the partitioning technique are (a) the partition size can exceed the capacity of available LSSD test generators, (b) the turnaround time to generate package tests is excessive, and (c) the turnaround time to re-generate package tests due to an engineering change is also excessive.

The present invention provides for a design approach and testing method which circumvents the afore-recited problems and will allow testing of each individual chip of a plurality of interconnected chips without physically disconnecting the chip under test and without the need for and utilization of test equipment having a precision probe head and a high precision step and repeat mechanism.

As will be fully apparent from the hereinafter set forth detailed description of our invention, the practice of our invention is not limited to any particular physical packaging structure. Merely by way of example, the high circuit density packaging structure containing a plurality of interconnected semiconductor chips may be generally of the type disclosed in one or more of the following patents: U.S. Pat. No. 4,245,273 entitled "Package For Mounting and Interconnecting A Plurality of Large Scale Integrated Semiconductor Devices" granted Jan. 13, 1981 to I. Feinberg and of common assignee herewith; U.S. Pat. No. 3,564,114 entitled "Universal Multilayer Printed Circuit Board" granted Feb. 16, 1971 to M. Blender et al; U.S. Pat. No. 4,263,965 entitled "Leaved Thermal Cooling Module" granted Apr. 28, 1981 to M. S. Mansuria et al. and of common assignee herewith, Ser. No. 133,898, filed Jan. 21, 1980; U.S. Pat. No. 4,138,692 entitled "Gas Encapsulated Cooling Module" granted Feb. 6, 1979 to Robert G. Meeker et al., and of common assignee herewith; U.S. Pat. No. 4,233,645 entitled "Semiconductor Package with Improved Conduction Cooling Structure" granted Nov. 11, 1980 to D. Balderes et al., and of common assignee herewith; U.S. Pat. No. 3,993,123 entitled "Gas Encapsulated Cooling Module" granted Nov. 23, 1976 to R. C. Chu et al., and of common assignee herewith; U.S. Pat. No. 3,726,002 entitled "Process For Forming A Multilayer Glass-Metal Module Adaptable For Integral Mounting to Dissimilar Refractory Substrate: granted Apr. 10, 1973 to B. Greenstein et al., and of common assignee herewith; U.S. Pat. No. 3,838,204 entitled "Multilayer Circuits" granted Sept. 24, 1974 to J. Ahn et al., and of common assignee herewith; U.S. Pat. No. 3,999,004 entitled "Multilayer Ceramic Substrate" granted Dec. 21, 1976 to 0. J. Chirino et al., and of common assignee herewith; U.S. Pat. No. 3,851,221 entitled "Integrated Circuit Package" granted Nov. 26, 1974 to P. E. Beaulieu and of common assignee herewith; and U.S. patent application Ser. No. 008,375 entitled "Improved Heat Transfer Structure For Integrated Circuit Package" filed Feb. 1, 1979 by E. Berndlmaier et al., and of common assignee herewith, granted as U.S. Pat. No. 4,323,914 on Apr. 6, 1982.

Background Art

The following patents and publications are directed to the testing of electronic structures. A number of these patents and publications further disclose LSSD testing arrangements and organizations. It is to be appreciated, with reference to the subject invention, that the following art is not submitted to be the only prior art, the best prior art, or the most pertinent prior art.

Patents:

U.S. Pat. No. 4,071,902 entitled "Reduced Overhead for Gated B Clock Testing" granted Jan. 31, 1978 to E. B. Eichelberger and T. W. Williams and of common assignee.

U.S. Pat. No. 4,051,353 (Ser. No. 701,055) entitled "Implementation of Level Sensitive Logic System Employing Accordion Shift Register Means" granted Sept. 27, 1977 to Hua-Tung Lee and of common assignee herewith.

U.S. Pat. No. 3,961,252 (Ser. No. 534,606) entitled "Testing Embedded Arrays" granted June 1, 1976 to E. B. Eichelberger and of common assignee herewith.

U.S. Pat. No. 3,961,254 (Ser. No. 534,608) entitled "Testing Embedded Arrays" granted June 1, 1976 to J. R. Cavaliere et al. and of common assignee herewith.

U.S. Pat. No. 3,961,251 (Ser. No. 534,605) entitled "Testing Embedded Arrays" granted June 1, 1976 to W. P. Hurley et al., and of common assignee herewith.

U.S. Pat. No. 4,063,080 entitled "Method of Propagation Delay Testing A Level Sensitive Embedded Array Logic System", filed June 30, 1976, granted Dec. 13, 1977 to E. B. Eichelberger, E. I. Muehldorf, R. G. Walther and T. W. Williams and of common assignee.

U.S. Pat. No. 4,051,352 entitled "Level Sensitive Embedded Array Logic System", filed June 30, 1976, granted Sept. 27, 1977 to E. B. Eichelberger, E. I. Muehldorf, R. G. Walther and T. W. Williams and of common assignee.

U.S. Pat. No. 3,789,205 entitled "Method of Testing MOSFET Planar Boards" granted Jan. 29, 1974 to R. L. James and of common assignee.

U.S. Pat. No. 4,006,492 entitled "High Density Semiconductor Chip Organization" filed June 23, 1975, granted Feb. 1, 1977 to E. B. Eichelberger and G. J. Robbins and of common assignee.

U.S. Pat. No. 4,063,078 entitled "Clock Generation Network" filed June 30, 1976 granted Dec. 13, 1977 to E. B. Eichelberger and S. Das Gupta and of common assignee.

U.S. Pat. No. 3,783,254 entitled "Level Sensitive Logic System" filed Oct. 16, 1972, granted Jan. 1, 1974 to E. B. Eichelberger and of common assignee.

U.S. Pat. No. 3,761,695 entitled "Method of Level Sensitive Testing A Functional Logic System" filed Oct. 16, 1972, granted Sept. 25, 1973 to E. B. Eichelberger and of common assignee.

U.S. Pat. No. 3,784,907 entitled "Method of Propagation Delay Testing A Functional Logic System" filed Oct. 16, 1972 granted Jan. 8, 1974 to E. B. Eichelberger and of common assignee.

U.S. Pat. No. 3,746,973 entitled "Testing of Metallization Network on Insulative Substrates Supporting Semiconductor Chips" granted July 17, 1973 to M. T. McMahon, Jr., and of common assignee.

U.S. Pat. No. 3,781,683 entitled "Test Circuit Configuration For Integrated Semiconductor Circuits and a Test System Containing Said Configuration" granted Dec. 25, 1973 to L. E. Freed and of common assignee.

U.S. Pat. No. 3,803,483 entitled "Semiconductor Structure For Testing of Metallization Networks on Insulative Substrates Supporting Semiconductor Chips" granted Apr. 9, 1974 to M. T. McMahon, Jr. and of common assignee.

U.S. Pat. No. 3,815,025 entitled "Large-Scale Integrated Circuit Testing Structure" granted June 4, 1974 to P. V. Jordan and of common assignee.

U.S. Pat. No. 4,055,754 entitled "Memory Device and Method of Testing the Same" granted Oct. 25, 1977 to G. D. Chesley.

U.S. Pat. No. 4,225,957 entitled "Testing Macros Embedded in LSI Chips" granted Sept. 30, 1980 to C. R. Doty, Jr., et al. and of common assignee.

U.S. Pat. No. 4,140,967 entitled "Merged Array PLA Device, Circuit, Fabrication Method and Testing Technique" granted Feb. 20, 1979 to P. S. Balasubramanian et al., and of common assignee.

U.S. Pat. No. 4,220,917 entitled "Test Circuitry For Module Interconnection Network" granted Sept. 2, 1980 to M. T. McMahon, Jr., and of common assignee.

U.S. Pat. No. 4,074,851 entitled "Method of Level Sensitive Testing A Functional Logic System with Embedded Array" granted Feb. 21, 1978 to E. B. Eichelberger and of common assignee.

U.S. Pat. No. 3,806,891 entitled "Logic Circuit For SCAN-IN/SCAN-OUT" granted Apr. 23, 1974 to E. B. Eichelberger et al., and of common assignee.

U.S. Pat. No. 4,244,048 (Yo 9-77-073) entitled "Chip and Wafer Configuration and Testing Method for Large-Scale-Integrated Circuits" granted Jan. 6, 1981 to F. F. Tsui and of common assignee.

Publications:

"Introduction to An LSI Test System" by M. Correia and F. B. Petrini, 14th Design Automation Conference Proceedings", June 20, 21 and 22, 1977, New Orleans, La., IEEE Catalog Number 77, CH 1216-1C, pages 460-1.

"A Logic Design Structure For LSI Testability" by E. B. Eichelberger and T. W. Williams, 14th Design Automation Conference Proceedings, June 20, 21 and 22, 1977, New Orleans, La., IEEE Catalog Number 77, CH 1216-1C, pages 462-8.

"Automatic Checking of Logic Design Structures For Compliance with Testability Ground Rules" by H. C. Godoy, G. B. Franklin and P. S. Bottoroff, 14th Design Automation Conference Proceedings, June 20, 21 and 22, 1977, New Orleans, La., IEEE Catalog Number 77, CH 1216-1C, pages 469-478.

"Test Generation For Large Logic Networks" by P. S. Bottoroff, R. E. France, N. H. Garges and E. J. Orosz, 14th Design Automation Conference Proceedings, June 20, 21 and 22, 1977, New Orleans, La., IEEE Catalog Number 77, CH 1216-1C, pages 479 to 485.

"Delay Test Generation" by E. P. Hsieh, R. A. Rasmussen, L. J. Vidunas and W. T. Davis, 14th Design Automation Conference Proceedings, June 20, 21 and 22, 1977, New Orleans, La., IEEE Catalog Number 77, CH 1216-1C, pages 486 to 491.

"Delay Test Simulation" by T. M. Storey and J. W. Barry, 14th Design Automation Conference Proceedings, June 20, 21 and 22, 1977, New Orleans, La., IEEE Catalog Number 77, CH 1216-1C, pages 492 to 494.

"Selective Controllability: A Proposal For Testing and Diagnosis" by F. Hsu, P. Solecky and L. Zobniw, 15th Design Automation Conference Proceedings, June 19, 20 and 21, 1978, Las Vegas, Nev., IEEE Catalog Number 78 CH 1363-1C, pages 110-116.

"Testability Considerations in A VLSI Design Automation System" by E. H. Porter (Paper 2.3) 1980 IEEE Test Conference, CH 1608-9/80/0000-0026 $00.75.

"Automatic Test Generation Methods For Large Scale Integrated Logic" by E. R. Jones and C. H. Mays, IEEE Journal of Solid-State Circuits, Vol. SC-2, No. 4, December 1967, pages 221-226.

"Techniques For The Diagnosis of Switching Circuit Failures", Proceedings of the 2nd Annual Symposium on Switching Theory and Logical Design, October 1960, pages 152-160.

"Semiconductor Wafer Testing" by D. E. Shultis, IBM technical Disclosure Bulletin, Vol. 13, No. 7, December 1970, page 1793.

"A Variation of LSSD and Its Implications on Design and Test Generation in VLSI" by S. Das Gupta, P. Goel, R. G. Walther and T. W. Williams, VLSI '81 International Conference, University of Edinburgh, Aug. 18-21, 1981, published in the "1982 IEEE Test Conference, Paper 3.3, pages 63-66."

"Enhancement Testability of Large Scale Integrated Circuits Via Test Points and Additional Logic", by M. J. Y. Williams and J. B. Angell, IEEE Trans. Comput., Vol. 22, pp. 46-60, January 1973.

"Designing LSI Logic For Testability" by E. I. Muehldorf, Digest of Papers 1976, Semiconductor Test Symposium, Memory & LSI, (Oct. 19-21, 1976 held at Cherry Hill, N.J.) sponsored by IEEE Computer Society and the Philadelphia Section of the IEEE, pages 45-49.

"Impact of LSI On Complex Digital Circuit Board Testing" by P. S. Bottoroff and E. I. Muhldorf, Testing Complex Digital Assemblies, Session 32, Electro 77 Professional Program Paper 32/3, pages 1 through 12, New York, Apr. 19-21, 1977, Copyright 1977 Electro.

"Enhancing Testability of Large-Scale Integrated Circuits Via Test Points and Additional Logic" by M. J. Y. Williams et al., IEEE Transactions on Computers Vol. C-22, No. 1, January 1973, pages 46-60.

"Automatic System Level Test Generation and Fault Location For Large Digital Systems" by A. Yamada, et al., 15th Design Automation Conference Proceedings, June 19, 20 and 21, 1978, Las Vegas, Nev., IEEE Catalog Number 78 CH 1363-1C, pages 347-352.

"LSI Chip Design for Testability" by S. Das Gupta et al., 1978 IEEE International Solid-State Circuits Conference, Digest of Technical Papers, February 1978, pages 216 and 217.

"Design For Testability of the IBM System/38" by L. A. Stolte et al., Digest of Papers, 1979, IEEE Test Conference (Oct. 23–25, 1979, Cherry Hill, N.J.) pages 29–36.

"Printed Circuit Card Incorporating Circuit Test Register" by E. I. Muehldorf, IBM Technical Disclosure Bulletin, Vol. 16, No. 6, November 1973, page 1732.

"AC Chip In-Place Test" by M. T. McMahon, Jr., IBM Technical Disclosure Bulletin, Vol. 17, No. 6, November 1974, pages 1607–08.

"Shunting Technique For Testing Electronic Circuitry" by R. D. Harrod, IBM Technical Disclosure Bulletin, Vol. 18, No. 1, June 1975, pages 204–05.

"Interconnection Test Arrangement" by J. D. Barnes, IBM Technical Disclosure Bulletin, Vol. 22, No. 8B, January 1980, pages 3679–80.

"Single Clock Shift Register Latch" by T. W. Williams, IBM Technical Disclosure Bulletin, Vol. 16, No. 6, November 1973, page 1961.

"Trigger Arrays" by S. Das Gupta, IBM Technical Disclosure Bulletin, Vol. 24, No. 1B, (June 1981) pages 615–616.

"Logic-Array Isolation by Testing" by P. Goel, IBM Technical Disclosure Bulletin, Vol. 23, No. 7A, December 1980, pages 2794–2799.

"Functionally Independent A.C. Test For Multi-Chip Packages" by P. Goel and M. T. McMahon, IBM Technical Disclosure Bulletin, Vol. 25, No. 5, October 1982, pages 2308–2310.

"Automated Data Base-Driven Digital Testing" by A. Toth et al., Computer (IEEE Computer Society) Volume 7, Number 1, January 1974, pages 13–19.

"Shift Register Latch For Package Testing in Minimum Area and Power Dissipation" by E. F. Culican, J. C. Diepenbrock and Y. M. Ting, IBM Technical Disclosure Bulletin, Vol. 24, No. 11a, April 1982, pages 5598–5600.

SUMMARY OF THE INVENTION

The invention is a design discipline, or approach, in the form of circuitry and a test method, or methodology, which obviates the problems of the prior art and allows the testing of each individual chip and interchip connections of a plurality of interconnected chips contained on or within a high density packaging structure. This testing is accomplished without the need for and utilization of test equipment having a precision probe and a high precision step and repeat mechanism.

As stated earlier herein and as will be more fully apparent from the detailed description of our invention set-forth hereinafter, the high density packaging structure containing a plurality of interconnected semiconductor chips may be generally of the type disclosed in IBM NEWS, SPECIAL EDITION, November 1980, Copyright 1980 by International Business Machines. The high density packaging structure is termed a "Thermal Conduction Module".

The "Thermal Conduction Module" has a sizeable number of chip sites available, for example, 100 or 118. The chips are placed on—and are interconnected by—a large, multilayer ceramic substrate whose power and input/output capability is provided through 1800 pins extending from the bottom of the substrate. The chip-populated substrate is placed in a cooling frame where spring loaded pistons that are part of the cooling "hat" subassembly come in contact with each chip. In addition to providing a housing for the pistons, the hat contains helium gas which also helps transmit heat from the chips. Subsequently, the hat is attached to a water (or liquid) cooled assembly.

The "Thermal Conduction Modules" multilayer ceramic substrate is formed from sheets of unfired (green) ceramic, which are "personalized" according to the function each sheet is to perform. First, thousands of minute holes, or vias, are punched in each sheet. The wiring pattern which conducts the electrical signals, is formed by screening a metallic paste onto the sheet through a metal mask. The via holes are also filled with this paste to provide the electrical connections from one layer or sheet to another. The layers are stacked and laminate together under heat and pressure. The laminate is then sintered in a process which shrinks it. This results in a substrate of tile-like hardness with the desired electrical characteristics. Additional metals are plated on the substrate to provide reliable contact surfaces for subsequent chip placement and pin attachments as well as for adding wiring. A finished substrate may have dimensions in the order of 90 millimeters (3.5 inches) square and 5.5 millimeters (2/10 inch) thick.

The technique of joining (connecting) the chips to the substrate may be generally in accordance with the method disclosed in U.S. Pat. No. 3,429,040 entitled "Method of Joining A Component To A Substrate" granted Feb. 25, 1969 to L. F. Miller.

(Reference is also made to the following publications: (1) "A Critique of Chip-Joining Techniques" by L. F. Miller, April 1970/Solid State Technology, Vol. 13/No. 4, pages 50–62; and (2) "A Fabrication Technique For Multilayer Ceramic Modules" by H. P. Kaiser et al., Solid State Technology/May 1972, Vol. 15/No. 5, pages 35–40).

As will be fully apparent from the detailed description hereinafter, the practice of the invention utilizes Level Sensitive Scan Design (LSSD) Rules, or constraints and requires some additional circuit and wiring at the chip level.

A primary object of the invention is an improved electronic testing technique and structure.

A further primary object of the invention is an improved chip test by isolation method and test structure.

A still further primary object of the invention is a testing method and test circuitry which permits the testing of each individual chip of a plurality of interconnected chips contained in a high density packaging structure without requiring excessively long test times. The test method and structure in accordance with the invention does not require chip in place testing using top surface probing or expensive test generation with through-the-pins testing.

A primary object of the invention is the reduction of test pattern generation requirements of second level packages and above to that required for chips.

A primary object of the invention is the simplification of the generation of test patterns to test for chip bonding (i.e., connection to substrate) and interchip wiring defects.

A feature of the invention is the elimination of probing of second level packages for final test, diagnostics and field return analysis.

BRIEF DESCRIPTION OF THE DRAWINGS

The foregoing and other objects, features and advantages of the invention will be apparent from the following more particular description of the invention and the preferred embodiment of the invention as illustrated in the accompanying drawings:

FIG. 7 schematically illustrates a chip having multiplexed output drivers and wherein (a) each output of a chip is controlled by a unique TSRL, and (b) each non-clock input is directly observable at a TSRL.

FIG. 8 schematically illustrates a chip having a chip input which is used as a portion of the LSSD clocking mechanism and wherein (a) the logical state of the input can be captured in an SRL, and (b) in test mode the chip input will not change the states of test-SRL's or SRL's which are multiplexed to chip outputs (as in FIG. 7).

FIG. 13 schematically depicts a package shift register, comprised of SRL's, and having a package scan input, a package scan output, a clock A input and a clock B input. The Shift Register of FIG. 13 is to be viewed in particular, in conjunction with the explanation of a Shift Register "Flush" Test set forth herein.

FIG. 14 schematically depicts a package shift register, comprised of SRL's, and having a package scan input, a package scan output, a clock A input and a clock B input. The Shift Register of FIG. 14 is to be viewed, in particular, in conjunction with the explanation of a Shift Register "Shift" Test set forth herein.

FIG. 15 shows idealized waveforms for a "Shift Test" of the shift register depicted in FIG. 14.

FIG. 18 shows an n input AND circuit and also depicts the n+1 tests required to test same.

FIG. 19 shows an n input OR circuit and also depicts the n+1 tests required to test same.

FIG. 20 depicts the N+1 tests obtained by combining the corresponding tests for the following examples, trivial dot (n=1), a dot with n=2, a dot with n=3, and where the dot results in an AND gate.

FIG. 32 shows a CUT non-clock input connected to a package net controlled by more than one shift register latch, where all but one of the shift register latches is connected to the non-controlling state.

FIG. 33 shows a CUT output connected to a package net which is also connected to outputs from other chips. The shift register latches controlling the other chip outputs are set to the non-controlling state.

FIG. 34 shows a CUT with the surrounding connected shift register latches and those package pins that control the CUT clock inputs treated as a logic partition.

FIG. 39 generally depicts a packaging structure generally of the type briefly disclosed hereinabove and referred to as a Thermal Cooling Module (TCM).

FIG. 40 depicts a substrate (or Multilayer Ceramic, MLC) having one hundred chips connected to contacts on one surface thereof and a sizeable number of package pins (for example 1800) on the opposite surface thereof. The substrate or MLC contains internal wiring (not shown) for interconnecting the chips and package pins.

DISCLOSURE OF THE INVENTION

Figure 1:
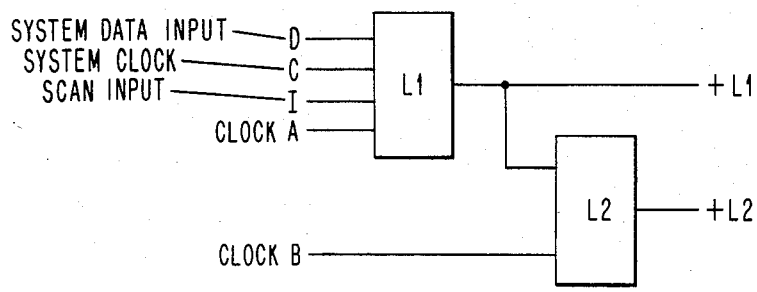
FIG. 1 is a block diagram representation of a shift register latch. The latch includes a first polarity-hold latch L1 and a second polarity-hold latch L2.

Electronic Chip-In-Place Test (ECIPT) is a structure and methodology which extends the usage of Level Sensitive Scan Design (LSSD) hardware and provides the following benefits:

(A) The problem of test generation for a large logic assembly, be it a Field Replaceable Unit (FRU) or a complete computer system, is reduced to one of generating tests for the individual logic chips that constitute the logic assembly. Test generation for the individual logic chips is done assuming complete controllability and observability of the chip inputs and the chip outputs respectively. The tests generated can then be re-applied at any level of chip packaging (module, card, board, frame etc.) using the external package pins only. (As used herein, the terms "package pins" and "external package pins" are used synonymously with the more general term "accessible package contact". Also the terms "chip pin" or "chip terminal" are used synonymously with the term "chip pad" and the more general term "chip connection").

(B) All levels of package wiring (i.e. wiring between chips and between package I/O's) are readily testable for both open and shorts failures. The tests are generated by a simple procedure and can be applied solely via external package pins. These tests are very few in number and yet provide almost complete checking of the package wiring. This permits very high tester throughput to test only for assembly defects. Furthermore, excellent diagnostic resolution is provided without a need for probing the package.

(C) Given a defective FRU it is feasible to retest each chip using the FRU external pins only. The re-test in worst cases provides diagnostic resolution to the failing chip, this facilitating the FRU repair process.

(D) The same tests applied at the chip level can be applied at the computer systems level, either at the manufacturing site or customer installation, using a maintenance processor. In this manner, inter package connection (card, board, cable, or Thermal Conduction Module, TCM), can be tested without having to generate test patterns at the systems level.

(E) The number of LSSD rules that need to be practiced across chip boundaries is substantially reduced, thus simplifying designer effort in achieving a testable design. The ECIPT structure obviates the need for practicing the LSSD discipline for the entire package. Instead it is required that the LSSD dicipline followed for each chip and for the package clock distribution network. Further, the LSSD requirement which ensures the capability of scanning data into and out of the package SRL's must be satisfied by the total package design. [The LSSD discipline is extensively disclosed and discussed in the testing art. See, for example: (1) U.S. Pat. No. 3,783,254 entitled "Level Sensitive Logic System" granted Jan. 1, 1974 to E. B. Eichelberger, of common assignee herewith; or (2) "A Logic Design Structure For LSI Testability" by E. B. Eichelberger and T. W. Williams, 14th Design Automation Conference Proceedings, pages 462–468, Jun. 20, 21 and 22, 1977, New Orleans, Louisiana, IEEE Catalog Number 77, CH 1216–1C].

(F) Since chip level tests can be re-applied at all levels of packaging, test generation resulting from an Engineering Change (EC) is confined to the EC'ed chips only. This process is substantially faster than current methods of re-generating tests for the entire package. This facilitates engineering bring-up.

(G) The technique can be applied to functional islands on a VLSI chip or package such that the individual functional islands may be subject to test generation as if their inputs and outputs were totally accessible.

ECIPT Design Structure

Figure 2:
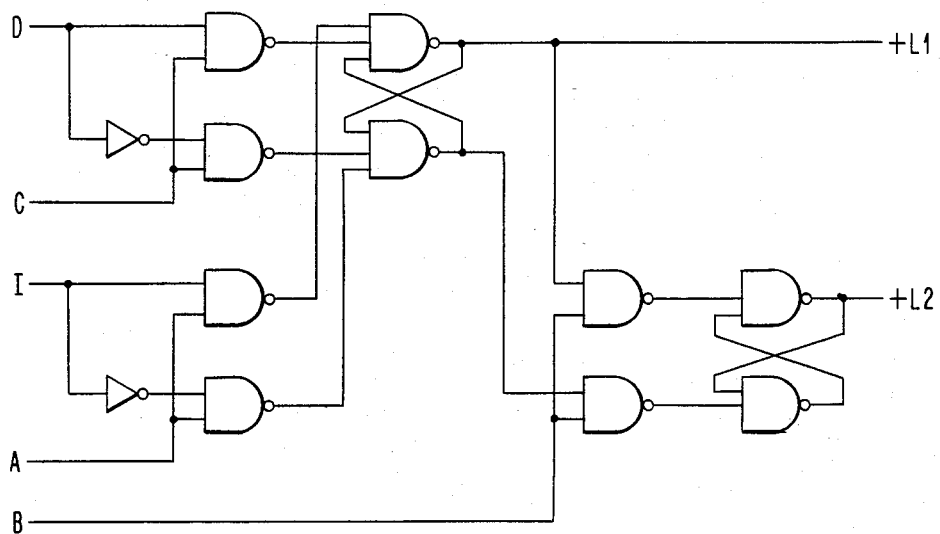
FIG. 2 discloses an implementation of the Shift Register Latch (SRL) of FIG. 1 in AND-INVERT gates.
Figure 3:
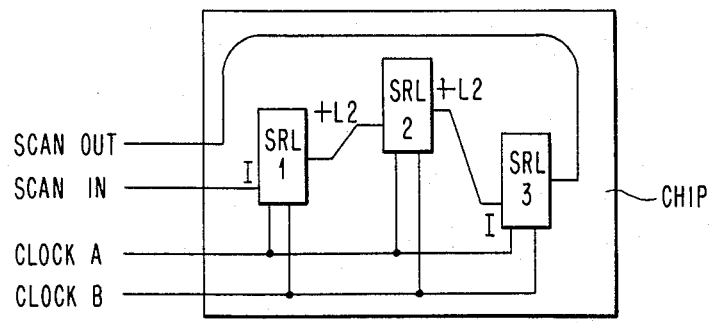
FIG. 3 discloses an integrated circuit chip with three interconnected SRL's.
Figure 4:
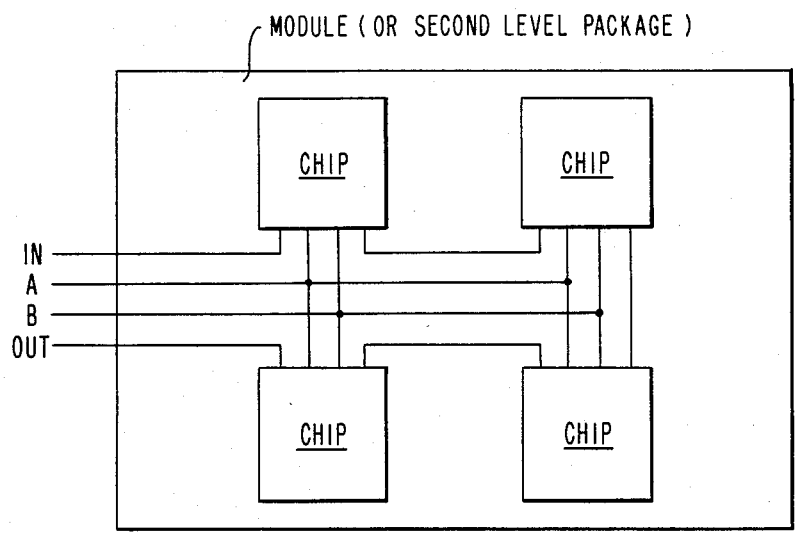
FIG. 4 discloses the interconnection of SRL's contained in an integrated circuit packaging structure, or module, which includes four interconnected integrated circuit chips.

ECIPT employs a design structure in which shift register latches (or SRL's) are employed as "extended" tester probes. FIG. 1 shows a schematic of an SRL. Generally an SRL consists of a pair of latches—the L1 latch and the L2 latch. FIG. 2 discloses an implementation of the Shift Register Latch (SRL) of FIG. 1 in AND-INVERT gates. As in FIGS. 3 and 4, any number of SRL's may be tied together to form a shift register. FIG. 3 discloses the interconnection of three SRL's contained on a single chip. FIG. 4 discloses the interconnection of the SRL's contained on four chips contained on a module, or packaging structure. (See for example, U.S. Pat. Nos. 3,761,695, 3,783,254 and 3,784,907). The L1 and L2 latches can have several data ports. Each data port is defined by a data input and a clock input such that when the clock input is pulsed, the logic state on the data input is stored in the latch. For correct operation it is assumed that a pulse is applied at the clock input of at most one data port of each latch. The L1 latch shown in FIG. 1 has a "scan" data port with a scan data input (I) and a scan clock (A). The L2 latch of FIG. 1 also has a "scan" data port with its scan data input connected to the output of the L1 latch and a clock (B). The 3-stage shift register of FIG. 3 is formed by (i) connecting the A clock inputs of all SRL's to a unique external A clock chip pad (A), (ii) connecting the B clock inputs of all SRL's to a unique external B clock chip pad (B), (iii) connecting a unique chip pad called the scan input (IN) to the I input of the first SRL in the shift register, and (iv) connecting the L2 output of the last SRL in the shift register to a unique chip pad called the scan output (OUT). Using the SCAN-IN, Clock A, Clock B and SCAN-OUT chip pads it is possible to preset (load) the shift register to any desired state or to observe (unload) the shift register state.

The structure is extended to further levels of packaging as shown in FIG. 4. Here, 4 chips have their SCAN-IN and SCAN-OUT pads connected in a serial fashion and brought out to unique module SCAN-IN and module SCAN-OUT pins. A clock and B clock chip pads are connected in parallel and brought out to unique module Clock A and module Clock B pins.

Figure 5:
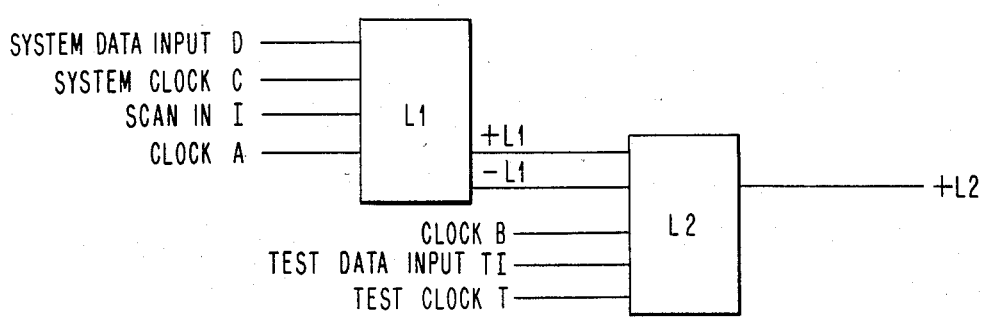
FIG. 5 discloses in accordance with the invention, an SRL wherein the latch L2 has a Test Data Port. An SRL having an L2 latch with a test data port is termed herein after a Test-SRL or TSRL.
Figure 6:
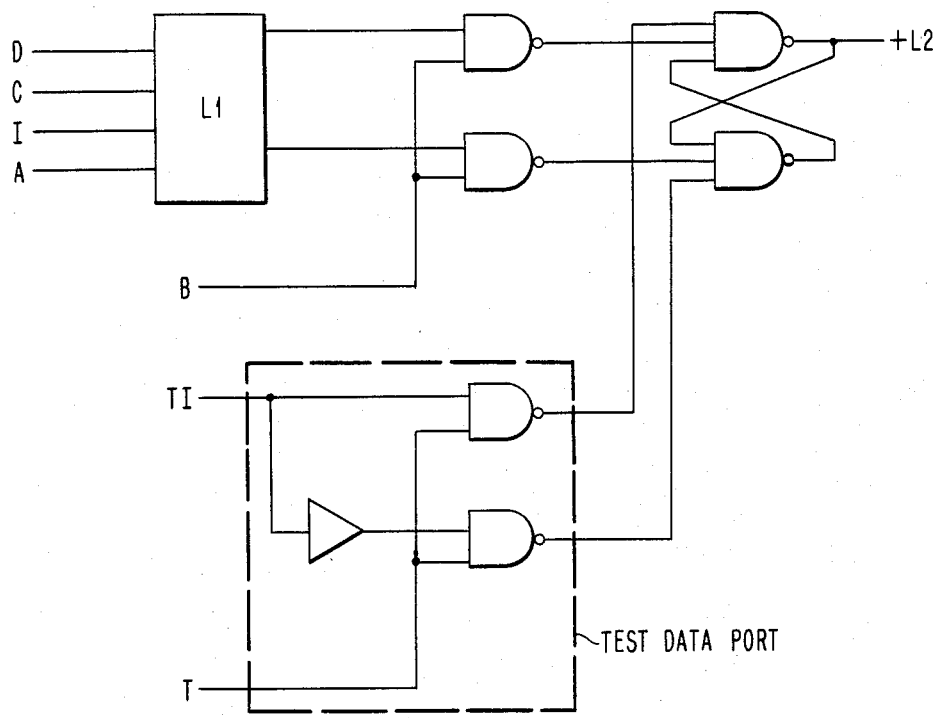
FIG. 6 discloses the Test-SRL; or TSRL of FIG. 5 implemented in AND-INVERT gates.

The scan data ports of the L1 and L2 latches are generally used for test purposes only, i.e. to load or unload the individual SRL's as desired. The L1 and L2 latches can have additional data ports for system usage of the SRL's (as in an LSSD design). The data port is shown in FIG. 1 with the system data input (D) and system clock input (C). For purposes of ECIPT, the L2 latch is capable of having a unique additional data port called the test data port. The test data port has a test data input (TI) and a test clock (T) input such that if the T-clock is pulsed, the L2 latch will store the state of the test data (TI) input. An SRL containing an L2 latch with a test data port is here after referred to as a Test-SRL or a TSRL and is shown in FIGS. 5 and 6.

The ECIPT structure provides the means whereby tests generated for a chip can be re-applied when the chip is packaged on a module, card, board, TCM, etc. The structure additionally provides the means for simplified test of failures associated with inter-chip wiring on any package level, as well as failures associated with chip inputs and outputs. The notion of a chip on a module is chosen strictly for ease of expression but it will be readily evident to persons skilled in the art that the structure and practice of the invention will apply to any logic connective with well defined boundaries.

PROVISION #1

SRL's and TSRL's are configured, in a test mode, such that:
(a) each output of a chip is controlled by a unique SRL, and
(b) each non clock input is directly observable at a unique TSRL.

There are several means possible to achieve conditions (a) and (b). FIG. 7 illustrates a multiplexing scheme whereby: (1) every chip driver can be controlled with the output of an L1 latch when the test mode control input is on (logical 1 level) and (2) every non clock chip input can be observed at the output of the L2 TSRL when the T input is on (logical 1 level) and the C input (refer to FIGS. 5 and 6) is off (logical 0 level).

While the L1 latch controlling chip drivers and the L2 latch with a test data port to construct a TSRL is the preferred embodiment, the invention is operable with the roles of the L1 and L2 reversed.

PROVISION #2

In cases where a chip input is used as part of the LSSD system clocking mechanism for that chip, the input must be gated such that:
(a) the logical state of the input can be captured in a unique SRL, and
(b) while the chip is in test mode, the input will not change the states of test-SRL's or SRL's which are multiplexed to chip outputs (as in FIG. 7).

FIG. 8 illustrates a mechanism to achieve conditions (a) and (b). The test mode control input signal is inverted and used to gate every system clock signal entering the chip.

PROVISION #3

Figure 9:
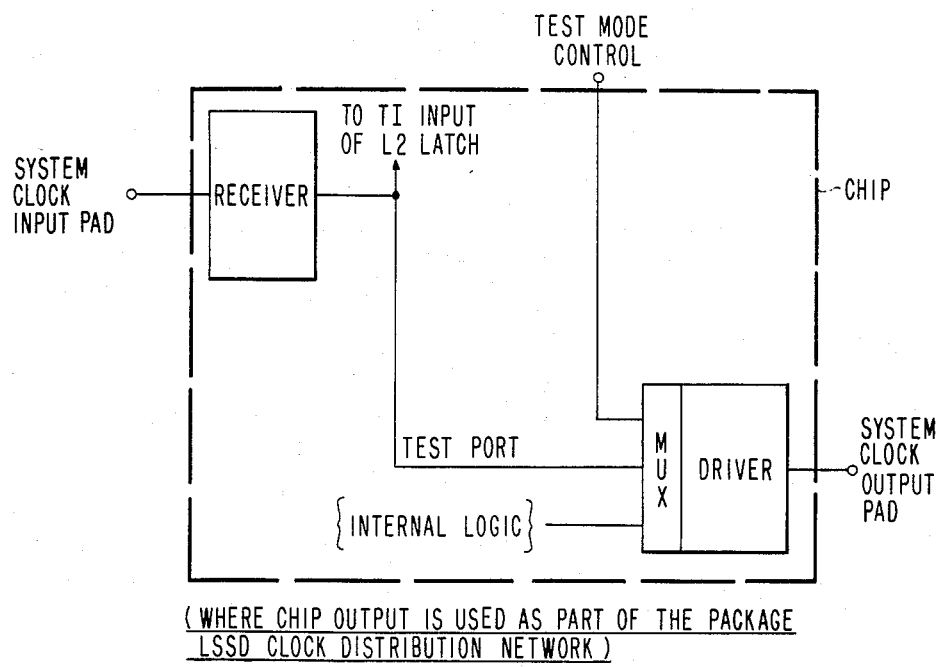
FIG. 9 schematically illustrates a chip output used as part of the package LSSD clock distribution network. This requires, as shown, that the test port of the MUX for that output must be driven from the corresponding clock Input receiver rather than an L1 SRL output.

In cases where a chip output is used as part of the package LSSD clock distribution network, the test data port for that output must be driven from the corresponding clock input receiver (as in FIG. 9), rather than an L1 SRL output.

If a chip provides a fan out function for a clock input, then each corresponding chip clock output must be connected as above.

PROVISION #4

Figure 10:
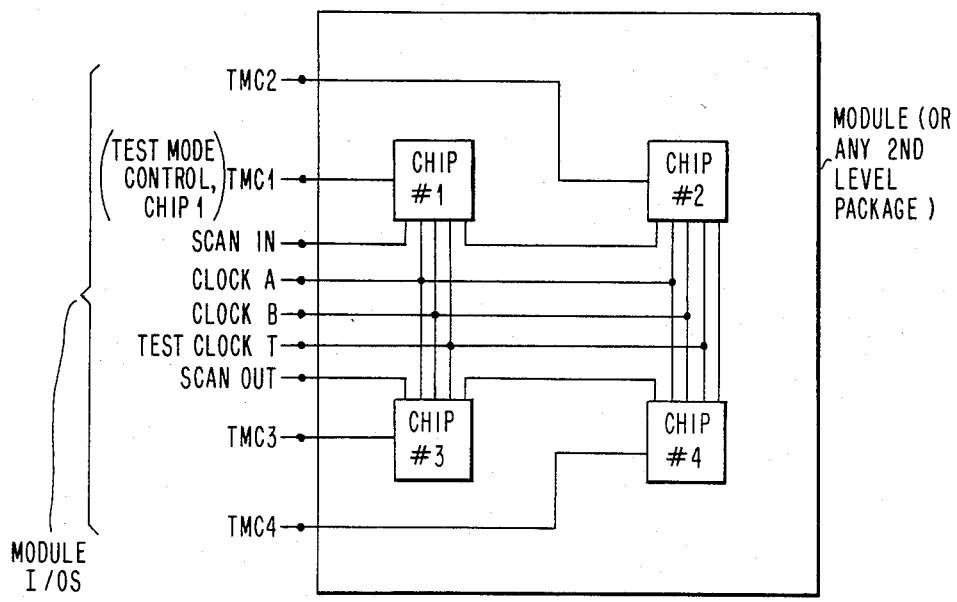
FIG. 10 schematically depicts four chips interconnected on a module (TCM, or any second level package) wherein "Scan In", "Scan Out", "Clock A", "Clock B", "Test Clock T" and "Test Mode Control" are brought out to module controls.

When chips containing the mechanism described in provisions 1, 2, and 3 are connected on a module (or any 2nd level package) the following conditions should be established (refer to FIG. 10):
(a) all shift register controls and data (SCAN-IN, SCAN-OUT, Clock A, Clock B) should be connected to module I/O's,
(b) all systems clocks should be controllable from module I/O's,
(c) the test clock (T) pad of each chip should be connected in a parallel network (similar to the A and B clock networks) and brought out to a module I/O, and
(d) the test mode control pad of each chip should be connected in a manner that allows each chip to be controlled separately. The test mode control input pad for each chip could be connected to a separate module I/O. A decoder arrangement could also be used to reduce the number of module I/O's required for modules with large numbers of chips.

Figure 11:
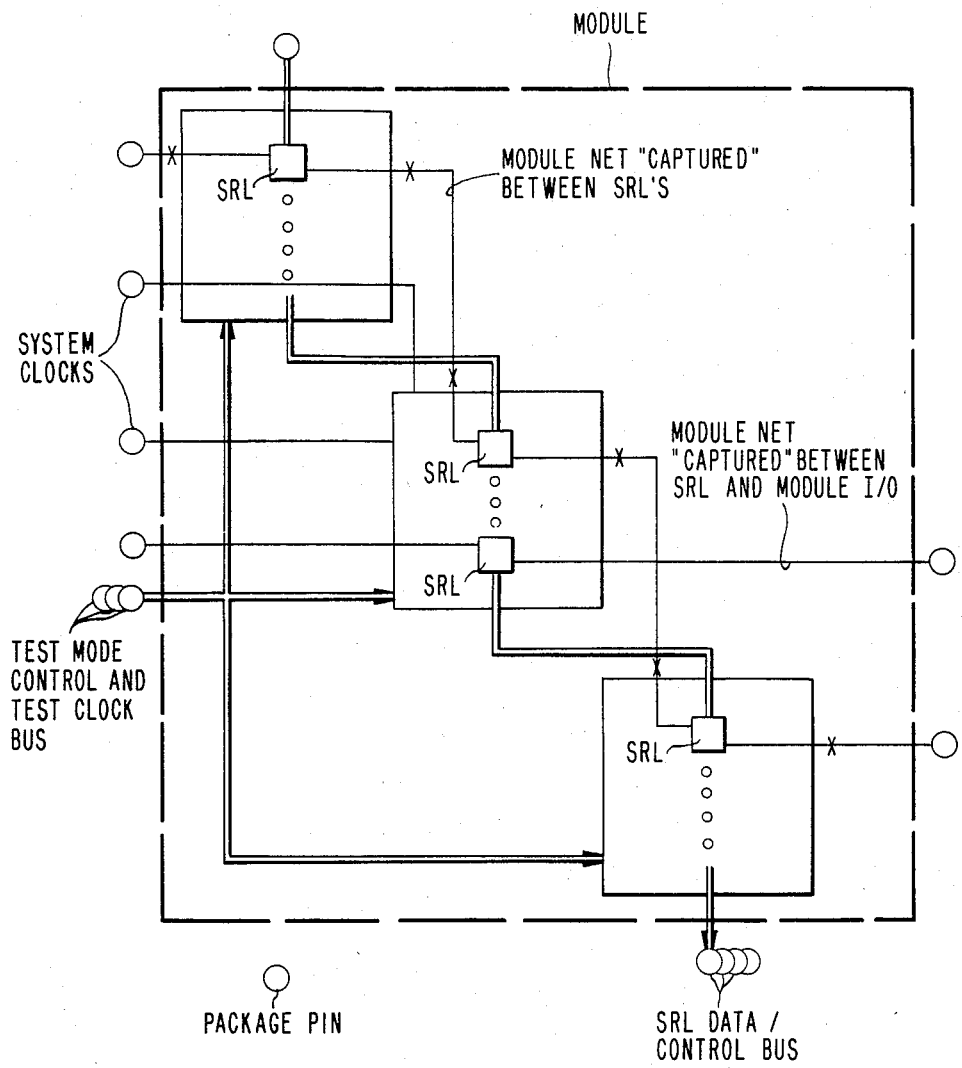
FIG. 11 schematically depicts a packaging structure (module, TCM, etc.) having all (only three shown) interconnected chips in the "Test Mode".

With conditions (a) through (d) present on a module (TCM, etc.) it is possible to place all of the chips in the test mode simultaneously insuring that each module net meets the following conditions (refer to FIG. 11):
(1) All nodes of a module net are contained between SRL's or
(2) All nodes of a module net are contained between module I/O's and SRL's.

Figure 12:
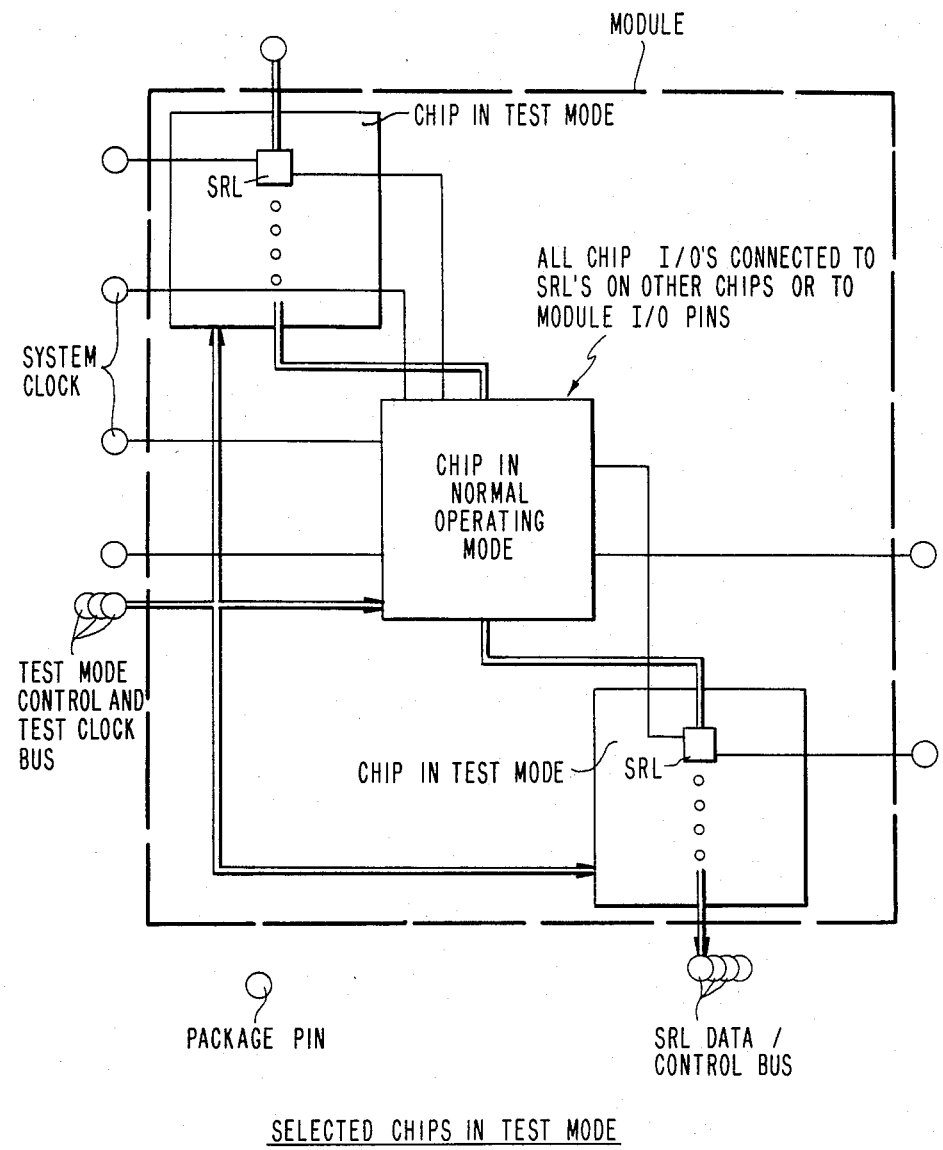
FIG. 12 schematically depicts a packaging structure (module, TCM, etc.) having all (only three shown) chips, except one in "Test Mode", the except one chip being in the "normal operating mode".

With conditions (a) through (d) present on a module it is possible to place all chips but one in the test mode, with the following environment applied to that chip (refer to FIG. 12):
(1) Non clock chip inputs are driven from SRL's on other chips or module I/O's.
(2) Chip clock inputs are driven either directly from module I/O's or indirectly from module I/O's through independent paths on other chips.
(3) Chip outputs drive SRL's or module I/O's.

The usage of each configuration will be fully described hereinafter where the test procedure is fully set forth.

Figure 41:
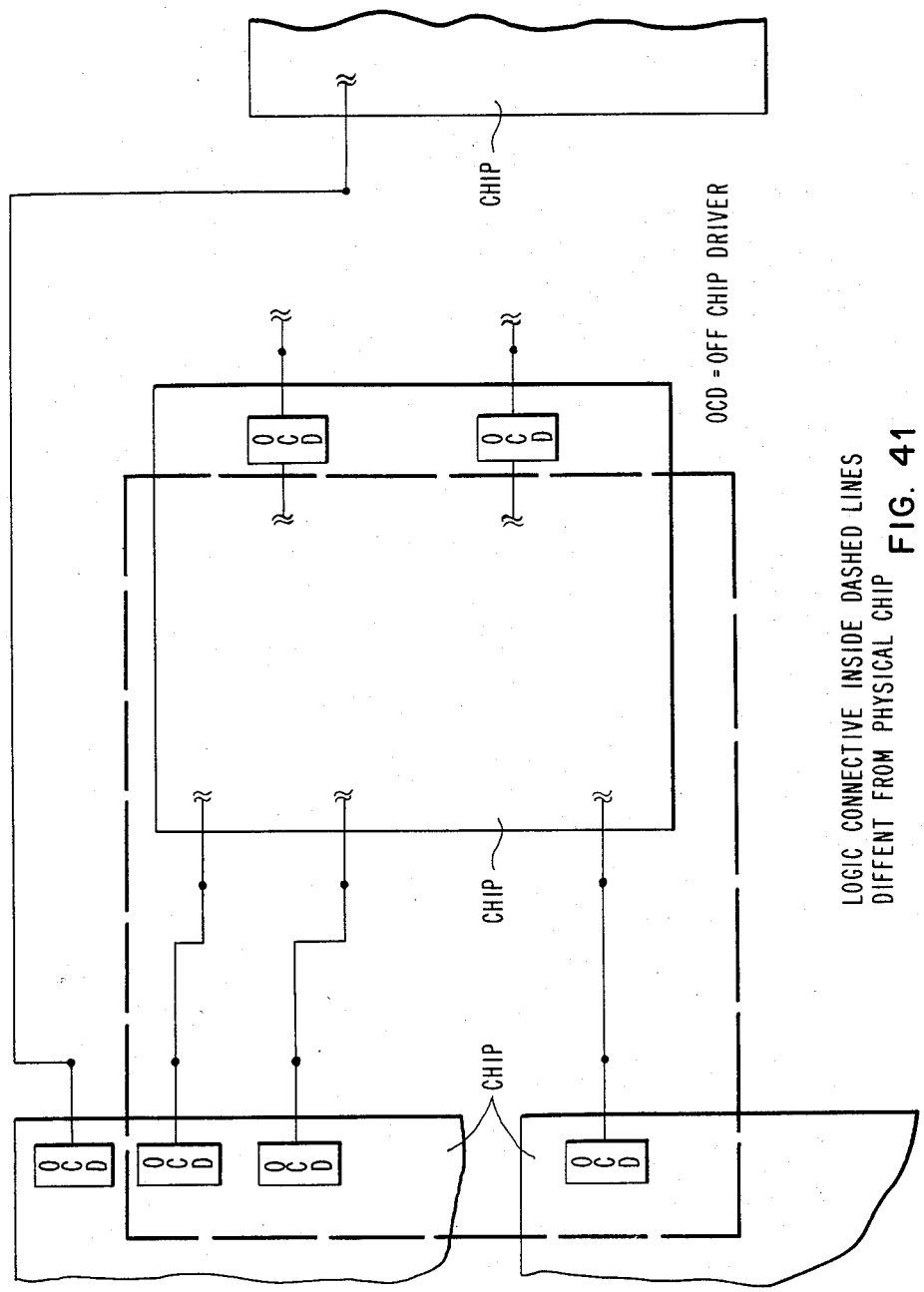
FIG. 41 depicts logic connective shown inside dashed lines different from physical chip.
Figure 42:
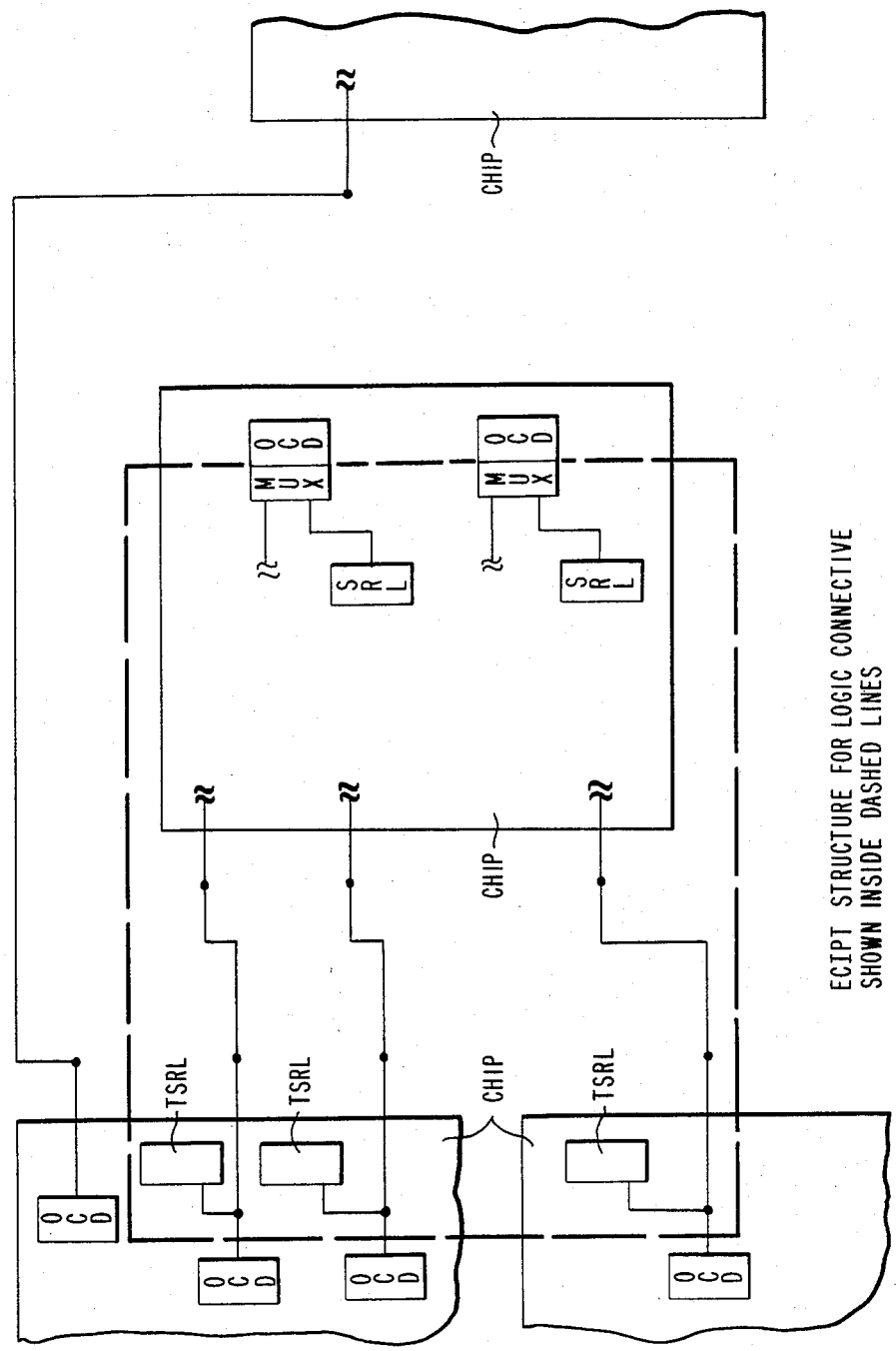
FIG. 42 depicts ECIPT structure for logic connective shown inside dashed lines.
Figure 43:
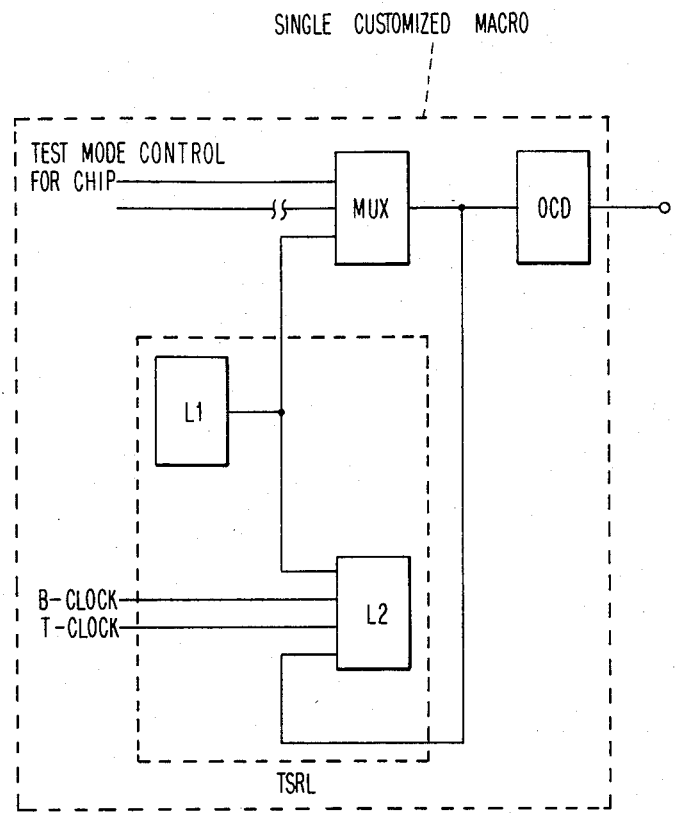
FIG. 43 illustrates single customized macro integrating OCD, MUX and TSRL to obtain ECIPT structure depicted in FIG. 42.

It was stated earlier herein that "the notion of a chip on a module is chosen strictly for ease of expression but it will be readily evident to persons skilled in the art that the structure and practice of the invention will apply to any logic connective with well defined boundaries". providing the ECIPT structure to a logic connective, different from a chip, is illustrated by FIGS. 41-43. In FIG. 41, the logic connective, shown enclosed in dashed lines, consists of a chip excluding its off-chip drivers but including those off-chip drivers (on other chips) that source an input of this chip. If all logic connectives are as shown in FIG. 41, the ECIPT structure of FIG. 42 can be implemented logically by using the L1/L2 latch pair of a test-SRL at each off-chip driver as in FIG. 43. The advantage afforded by this configuration is that the connections between and the circuitry constituting the test-SRL latches, MUX, and off-chip driver (OCD) can be customized into a single macro. Unlike the ECIPT structure of FIG. 43, the ECIPT structure of FIG. 42 requires a more complex package wiring test.

Chip Testing Procedure

The test generation process for an ECIPT chip is similar, (or essentially identical) to that employed for a chip with Level Sensitive Scan Design (LSSD) logic and has been widely published. All of the apparatus and program controls necessary for generating the test patterns and performing the tests are known in the art. For example, the programs necessary to develop the test patterns for performing combinational tests on a unit or chip under test are described in a paper entitled "Algorithms for Detection of Faults in Logic Circuits" by W. G. Bouricius et al., which was published in Research Report RC 3117 by the IBM Thomas J. Watson Research Center on Oct. 19, 1970. An algorithm for the computation of tests for failures is described in "Diagnosis of Automata Failures A Calculus and a Method" by J. Paul Roth in the IBM Journal of Research and Development, July 1966. These papers described how to develop programmed algorithms for test generation and test evaluation. These include the generation of the assumed fault data necessary for the automatic test generation system.

It is to be understood that the invention of this application does not reside in the generation of the test patterns for application to a unit, or chip under test but rather is directed to the structure of the unit and method of testing the unit when the patterns are applied to it. To accomplish the testing of a unit or chip, the requirements of LSSD and the invention must be present in the unit.

The actual application of tests for an ECIPT chip is similar (or essentially identical) to that employed for LSSD chips and systems and is extensively disclosed in the art. For example, U.S. Pat. Nos. 3,783,254, 3,761,695, 3,784,907 and the earlier identified publications set forth in the 14th Design Automation Conference Proceedings, June 20, 21 and 22, 1977, New Orleans, Louisiana, IEEE Catalog Number 77, CH 1216-1C, pages 460-1.

Package Testing Procedure

Logic testing of an ECIPT package containing one or more ECIPT chips can be broken down into three distinct phases - (a) The Shift Register Test, (b) The Package Wiring Test, and (c) the Chip Internals Test. The three phases are carried out in the sequence listed above.

The Shift Register Test (or SR Measurement Test)

The shift register test is such that it assures the functionality of the shift register. (It is understood that the Shift Register is comprised of Shift Register Latches (SRL's) and Test Shift Register Latches, (TSRL's). The test data is composed of two tests—a Flush Test and a Shift Test. The Flush Test is one in which (i) the package input pins are set to the LSSD scan state, (ii) the A and B clocks of the LSSD shift register are held to their "on" or "active" states, (iii) a 010 sequence is applied to the package scan input pin, (SI) and (iv) a corresponding 010 sequence is measured at the package scan output pin (SO) if there is an even number of polarity inversions between SI and SO along the shift register, as in FIG. 13, otherwise, a 101 sequence is measured at SO. The Shift Test is one in which (i) the package input pins are set to the LSSD scan state, (ii) a sequence of 01100 is applied on the SI pin, (iii) an A-clock pulse followed by a B-clock pulse is applied after each 0/1 value is set on the SI pin in the sequence 01100, and (iv) an A-clock pulse followed by a B-clock pulse is applied a sufficient number of times thereafter such that the sequence applied on the SI pin propagates to the SO pin where it is measured after adjustment for polarity inversions—as in FIG. 14. (Reference is made to the waveforms of FIG. 15). Any sequence of values applied on the SI pin in the Shift Test is satisfactory as long as it assures that each Shift register latch will be exercised through all possible combinations of initial state (0 or 1) and succeeding state (0 or 1) and each combination will be measured at the SO pin after shifting through the remaining portion of the shift register.

The Package Wiring Test (all chips in test mode)

Figure 16:
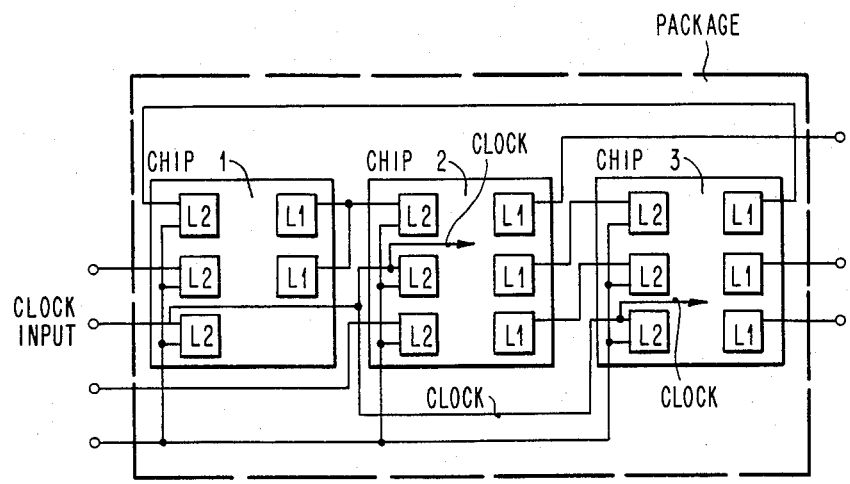
FIG. 16 shows an integrated circuit package including all (only three shown) chips in the "Test Mode" in preparation for performing a "Package Wiring Test".

The purpose of this test is to detect and diagnose (a) failures associated with the terminals or pins (pad connections) of the chips mounted on the package and (b) failures associated with the package wiring that interconnects the terminals or pins (pad connections) of these chips of the package. As described in the earlier description of the ECIPT structure and as illustrated in FIG. 16, each chip of a ECIPT package can be simultaneously placed into a test mode in which (a) each non-clock output pin is controlled by a unique shift register L1 latch, (b) each clock output pin is controlled by a corresponding clock input pin of the same chip, and (c) each input pin state can be latched into a unique shift register L2 latch by pulsing the package T-clock once. Before all chips on the package are placed in the test mode, the individual shift register latch pairs (L1 and L2 latch pair) can be set to any desired state using the LSSD shift register load capability. Similarly, after pulsing the T-clock with the package in the test state, the contents of each shift register L2 latch can be observed by using the LSSD shift register unload capability. In effect, each chip output pin is made externally and independently observable by using the procedure outlined above. Along with the direct controllability and observability of the package input pins and package output pins, respectively, it is a simple matter to test the package wiring. (Note with "flip-chip" wiring of the chip to the substrate, as disclosed in U.S. Pat. No. 3,429,040, the terminals or pins of a chip are in reality pad connections).

Figure 17:
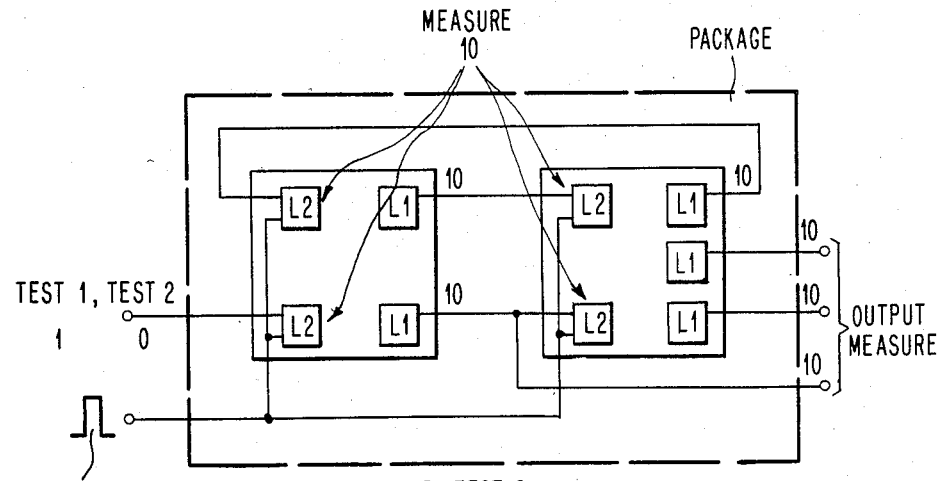
FIG. 17 shows an integrated circuit package including all (only two shown) chips in the "Test Mode" in preparation for performing a "Package Wiring Test" (with no dotting of chip outputs).

If the package is such that no dotting of chip outputs is permitted, then two independent tests are sufficient to test the chips pins and package wiring for stuck-at-1 and stuck at-0 faults as shown in FIG. 17. The first test is one in which (a) each chip output pin is driven to a 1 state by initially loading the associated shift register latches to a 1 state and setting all chips to the test mode (b) each package input pin is set to a 1 state, (c) the T-clock is pulsed to capture each chip input pin state into a unique shift register L2 latch, (d) each package output pin is measured for a 1 state, and (e) the shift register is unloaded and measured for 1's in each shift register latch that should have captured a chip input pin state. The second test is identical to the first test except that the 0 state is applied or measured in place of the 1 state.

Figure 21:
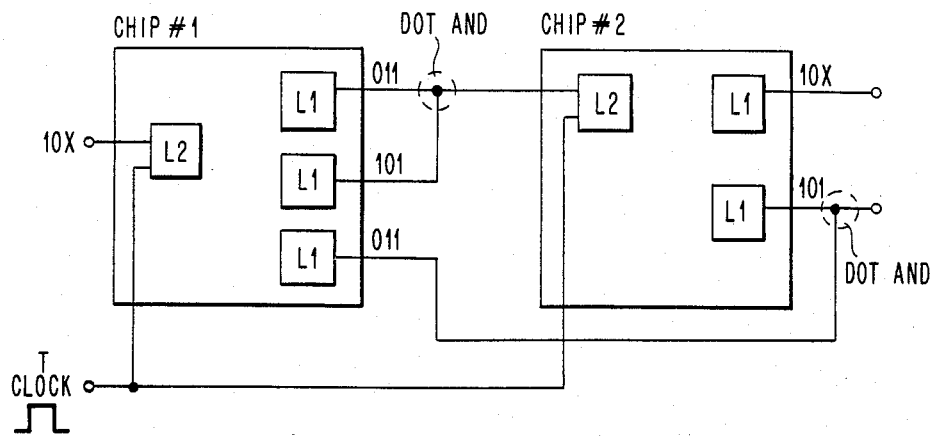
FIG. 21 depicts, relative to a package wiring test, the three tests needed when at most two chip outputs are dotted together anywhere on the package.

If the package has instances of two or more chip outputs being dotted N+1 tests are sufficient to test the chip pins and package wiring for single stuck-at-0 and stuck-at-1 faults where N is the maximum number of chip outputs dotted together anywhere on the package. Dotting of n output pins results in the creation of an n-input, single output logic gate (AND or OR) which requires n+1 tests for single s-a-0 and s-a-1 faults on its inputs and outputs. FIG. 18 shows the n+1 tests for an n input AND gate. FIG. 19 shows the n+1 tests for an n input OR gate. Since the inputs of each dot on the package can be controlled and observed independent of each other, all dots can be tested in parallel—hence N+1 tests are sufficient if N is the maximum number of chip pins dotted on the package. A chip output pin which is not dotted with another chip output pin on the package may be treated as a trivial dot with a single input and a single output requiring two tests - application and measurement of a 1 and of a 0. The N+1 tests of a package with a maximum of N pins dotted together are obtained by simply combining the corresponding 1, 2, —, N+1 tests of each independent dot (note a chip output pin which is not dotted with another is treated as a trivial dot with n=1). In combining the tests of the independent dots, the output and the inputs of each dot with n (for each n<N) inputs are set to the don't care or X state for all tests M where N+1<M<N+1 (where n is defined as the number of inputs to a dot). N is defined as the maximum number of chip pins dotted on the package and M is one of the N+1 tests for the package wiring. FIG. 20 shows the N+1 tests obtained by combining the corresponding tests for an example with a trivial dot (n=1), a dot with n=2, a dot with n=3, and where the dot results in an AND gate. FIG. 21 depicts the three tests needed for an example in which at most two chip outputs are dotted together anywhere on the package.

Figure 22:
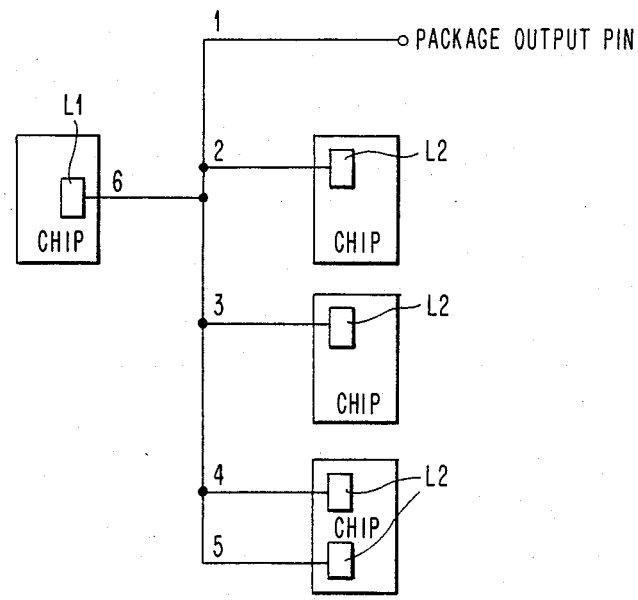
FIG. 22 illustrates a package network that interconnects a chip output pin, first, second, third and fourth chip input pins and a package output pin. In the package wiring test the one through six portions of the package net are independently diagnosable based on observed values at the package output pin and the four L2 latches.
Figure 23:
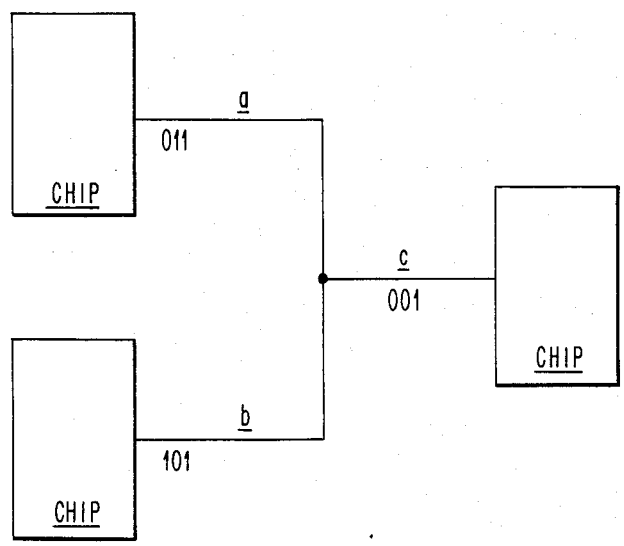
FIG. 23 illustrates a package wiring test of a package net that starts at more than one chip output pin (or package input pin) and wherein it is possible to diagnose distinguishable single stuck faults to the portion of the net that is unique to an individual chip output pin (or package input pin) since the effect of each portion can be observed independently in different tests as in FIG. 23.

Excellent diagnostic resolution of single stuck faults on chip pins or on the package wiring is achievable with the test procedure described above. Based on the simple tests described above, single stuck faults are immediately diagnosable to the failing package net. For a package net that starts at a single chip output pin or package input pin and terminates at a single chip input pin or package output pin, the diagnostic resolution cannot be enhanced any further. For package nets that terminate at more than one chip input pin or package output pin it is possible to diagnose single stuck faults to the portion of the net which connects to the individual chip input pin or package output pin—since each such portion of the net is independently observable as in FIG. 22. For package nets that start at more than one chip output pin or package input pin it is possible to diagnose distinguishable single stuck faults to the portion of the net that is unique to an individual chip output pin or to a package input pin since the effect of each portion can be observed independently in different tests as in FIG. 23.

Figure 24:
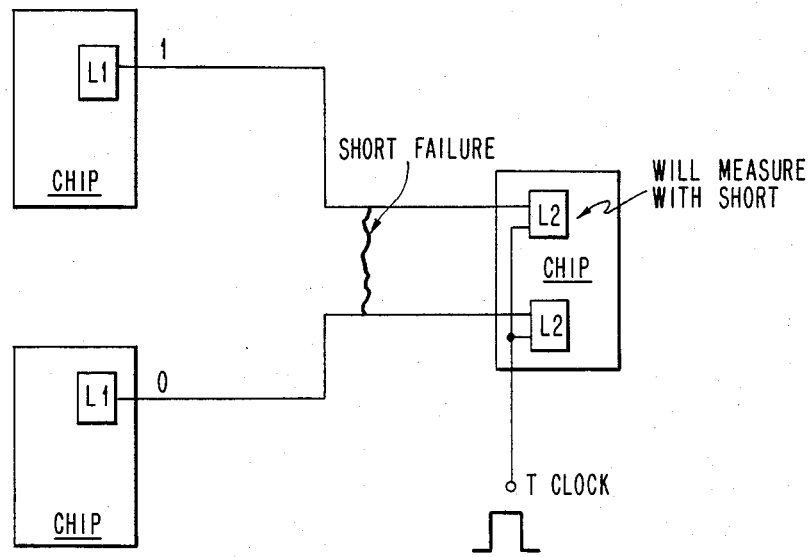
FIG. 24 illustrates a package wiring test for a short between two package nets.

Shorts between package nets can also be detected using single tests similar to the ones applied for single stuck faults on the package nets. FIG. 24 shows a short of two distinct package nets (assumed to create a dot AND) and the corresponding test which can be applied in exactly the same manner as the tests for single stuck faults on the package wiring. It is thus a simple matter to generate tests for and detect shorts associated with package nets—the sources of these nets being independently controllable and the sinks being independently observable.

The Chip Internal Test

The chip internal test procedure is described for one of the chips on the package. (The chip (or chips) whose internal circuitry is under test is referred to as "Chip Under Test" or CUT). In order to test the internals of a chip it is necessary to place its "neighboring chips" in the test mode for some portion of each test. The neighboring chips are those whose outputs either connect directly to an input or to an output of the chip being tested. Not all chips on a package need necessarily be neighboring a chip to be tested. Hence, it may be possible to simultaneously test another chip which is not a neighbor to the first chip being tested. In a similar manner, other such chips may be tested simultaneously with the first chip. It is intended that the same procedure be applied either one at a time to each chip to be tested on the package or to as many chips as possible being tested in one pass while using multiple passes to ensure that all chips get tested. The chip whose internals are to be tested is hereinafter also referred to as the chip under test (abbreviated to CUT).

Figure 25:
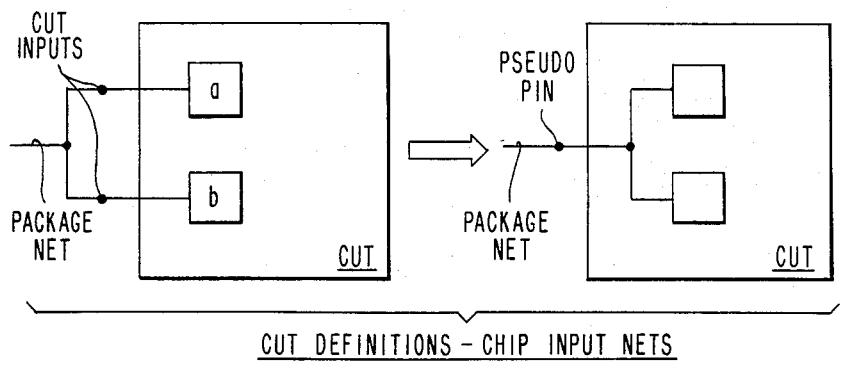
FIG. 25 llustrates the condition where more than one input pin of a chip under test, CUT, is connected to a package net. The commonly connected input pins of the CUT are treated for test purposes as a "pseudo" input pin of the CUT.
Figure 26:
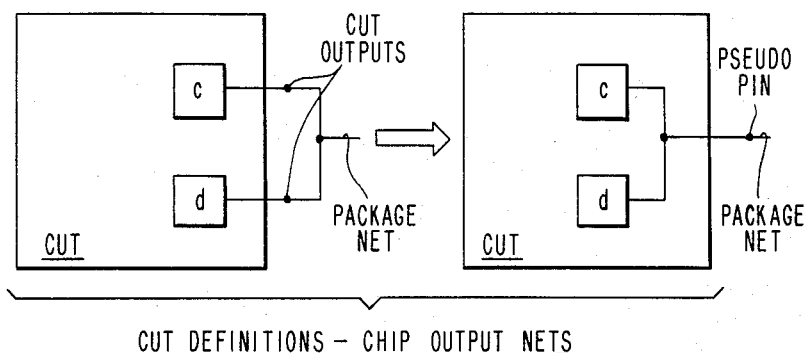
FIG. 26 illustrates the condition where more than one output pin of a chip under test, CUT, is connected to a package net. The commonly connected output pins of the CUT are treated for test purposes as a "pseudo" output pin of the CUT.

For ease of description, it is assumed that at most one input pin of the CUT is connected to one package net. Otherwise, the CUT is redefined for test generation purposes by replacing two or more CUT inputs connected to one package net by a single "pseudo" input to the CUT. The "pseudo" input is connected to the same package net and is connected to each of the on-chip circuits that were driven by the replaced CUT inputs—see FIG. 25. The above redefinition preserves the original function of the CUT on the package. Similarly, it is also assumed that at most one output pin of the CUT is connected to one package net. Otherwise, the CUT is redefined for test purposes by replacing two or more CUT outputs connected to one package net by a single "pseudo" output to the CUT. The "pseudo" output is connected to the same package net and is connected to each of the on-chip circuits that were driving the replaced CUT outputs—see FIG. 26. Again the above redefinition preserves the original function of the CUT on the package.

Figure 27:
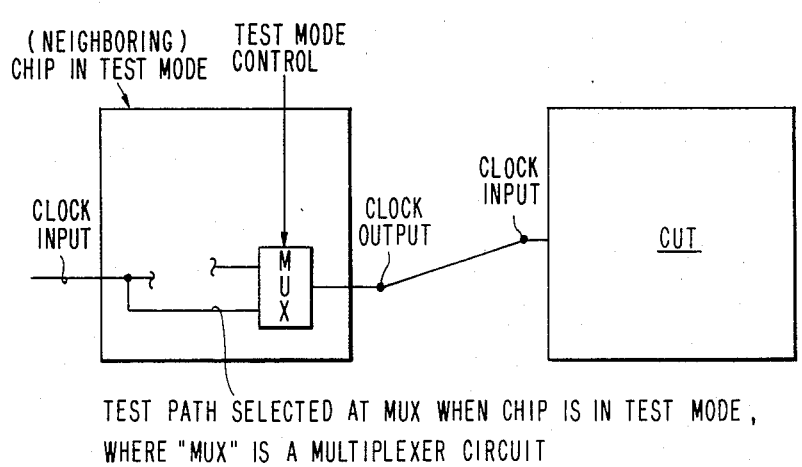
FIG. 27 shows an example where a clock signal for the chip under test, CUT, is actually produced as an output of a neighboring chip which is placed in the test mode.
Figure 28:
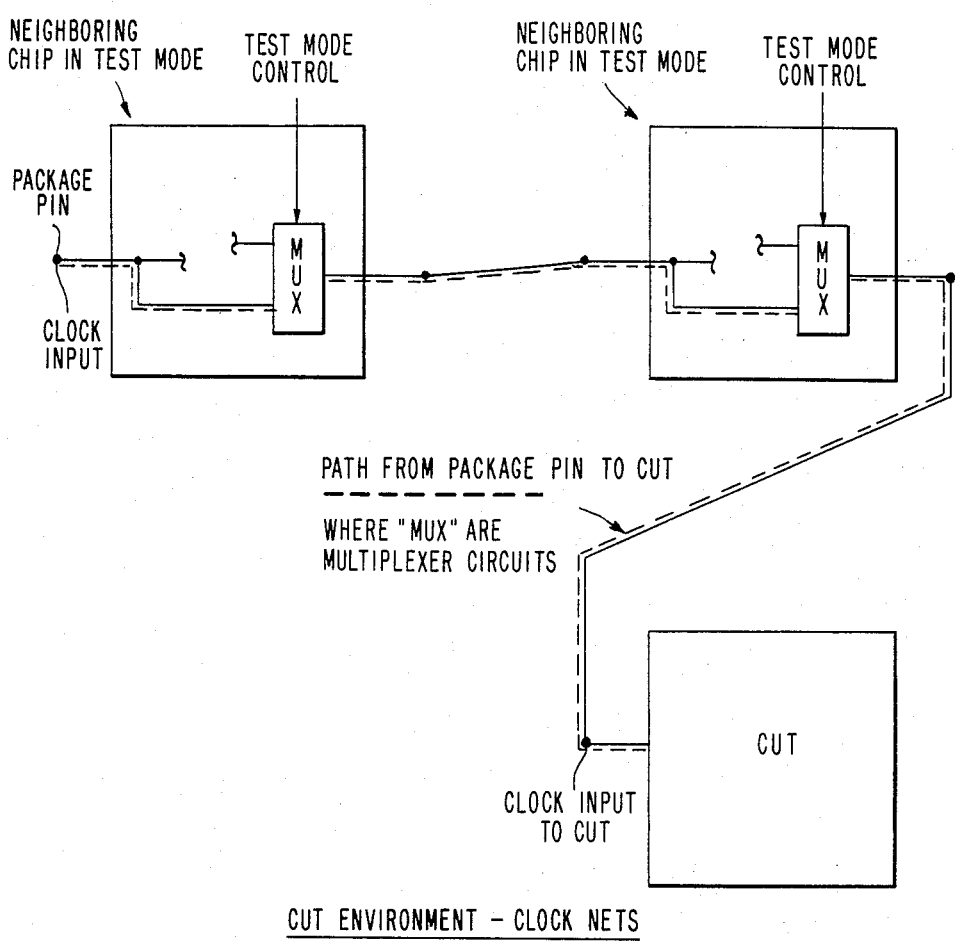
FIG. 28 shows an example where a clock signal for chip under test, CUT, is generated through several (two shown) neighboring chips which are respectively placed in the test mode.

For ease of description, it is assumed that the clock inputs of the CUT are directly controlled from unique package input pins. FIG. 27 shows an example where the clock signal for the cut is actually produced as an output of a neighboring chip. When the neighboring chip of FIG. 27 is placed in test mode, the ECIPT structure assumes that the clock output pin is controlled uniquely for a clock input pin of the neighboring chip. The clock signal of the CUT could indeed be generated through several chips; however, placing those chips in test mode assures that the CUT clock signal is directly controlled from a package clock pin—as in FIG. 28.

Figure 29:
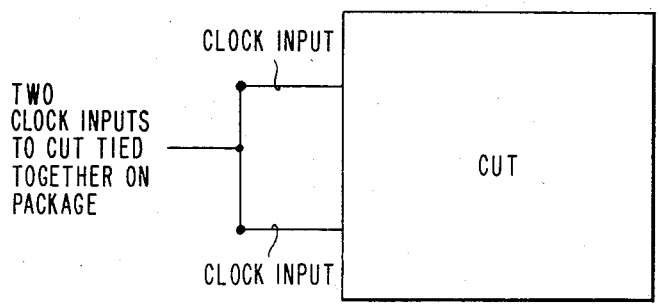
FIG. 29 shows two clock inputs to the chip under test, CUT, tied together on the package.
Figure 30:
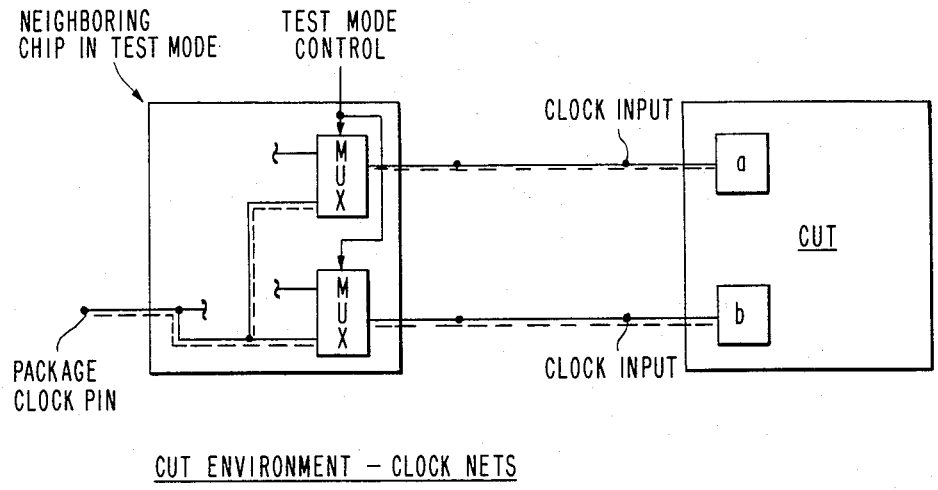
FIG. 30 shows two clock inputs to the chip under test, CUT, controlled by the same package input pin through a neighboring chip (or chips, only one shown) which is in the test mode.
Figure 31:
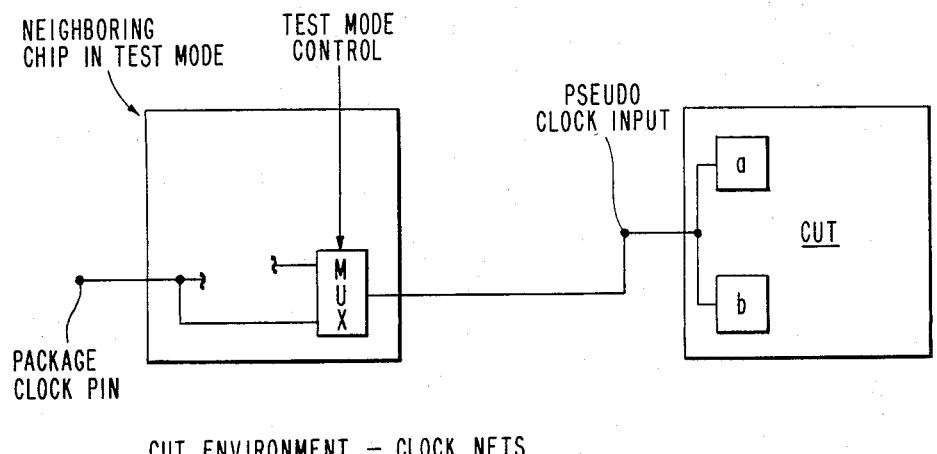
FIG. 31 shows a "pseudo" clock input for the chip under test, CUT, (which replaces the two chip clock inputs of FIG. 30) with the pseudo clock input being controlled from the same package pin and also connecting to the internal CUT circuits a and b.

Suppose two clock inputs to the CUT are either tied together on the package as in FIG. 29 or controlled from the same package pin (through some neighboring chips) as in FIG. 30. The CUT can be then redefined for test generation purposes to have a single "pseudo" input signal replacing the two clock inputs with the "pseudo" input being controlled from the same package pin and also connecting to those internal CUT circuits a and b to which the replaced clock input signals were connected—see FIG. 31. Hence, for purposes of further description it is assumed that each CUT clock input is directly controlled by a unique package clock pin—without loss of generality.

If all neighboring chips of a CUT are placed in the test mode, then (a) the clock inputs of the CUT are directly controllable from package input pins, (b) each of the package nets connected to the non-clock inputs of the CUT are directly controllable from one or more unique package input pins or shift register latches, and (c) each of the package nets connected to the outputs of the CUT are directly observable at one or more package output pins or shift register latches.

For ease of description, it is also assumed that the package nets connected to the non-clock inputs of the CUT are directly controllable only from one or more unique shift register latches. If package input pins also control the package nets, it is a simple matter to set the needed package pins to non-controlling states (0 if the package dot function is an OR, 1 if the package dot function is an AND) after the initial shift register load. Again, for ease of description, it is assumed that the package nets connected to the outputs of the CUT are directly observable only at one or more unique shift register latches—by first pulsing the T-clock and subsequently unloading the shift register. If package input pins are also involved, it is a simple matter to observe these pins prior to applying the T-clock. Where a CUT non-clock input is connected to a package net controlled by more than one shift register latch, it is a simple matter to initialize all but one of these shift register latches to the non-controlling state (0 if the package dot function is an OR, 1 if the package dot function is an AND) as in FIG. 32. Therefore, for purposes of testing it can be assumed that each non-clock CUT input is directly controlled from a unique shift register latch. Where a CUT output is connected to a package net which is also connected to outputs from other chips, the shift register latches controlling the other chip outputs may also be initialized to the non-controlling state (see definition above) as in FIG. 33. Therefore, for purposes of testing it can be assumed that each CUT output is directly observable at a unique shift register latch—by pulsing the T-clock and subsequently unloading the shift register. As stated earlier, the clock inputs of the CUT are directly controlled from package input pins.

The tests for a CUT can be generated in one of two ways—either (a) the CUT with the surrounding shift register latches and those package pins that control the CUT clock inputs be treated as a logic partition (FIG. 34) in the sense described in the prior art references, fully identified supra herein. (Specifically, U.S. Pat. Nos. 3,783,254, 3,761,695, 3,784,907 and the earlier identified publications set forth in the 14th Design Automation Conference Proceedings, June 20, 21 and 22, 1977, IEEE Catalog Number 77, CH 1216-1C) or (b) the CUT tests may be generated on a stand-alone basis and be migrated to the surrounding shift register latches and package pins. We shall describe the migration approach in detail since the logic partition approach has been further described in published literature.

Figure 35:
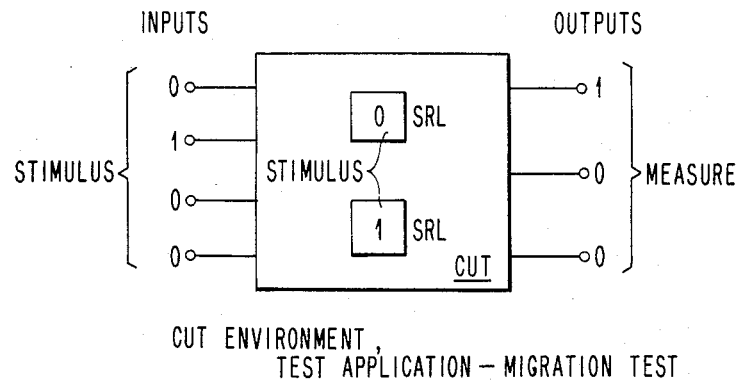
FIG. 35 depicts a migration stand-alone CUT test where the test stimuli consist of initial values applied to the shift register latches and inputs of the CUT, and the test responses consist of measuring the outputs of the CUT.
Figure 36:
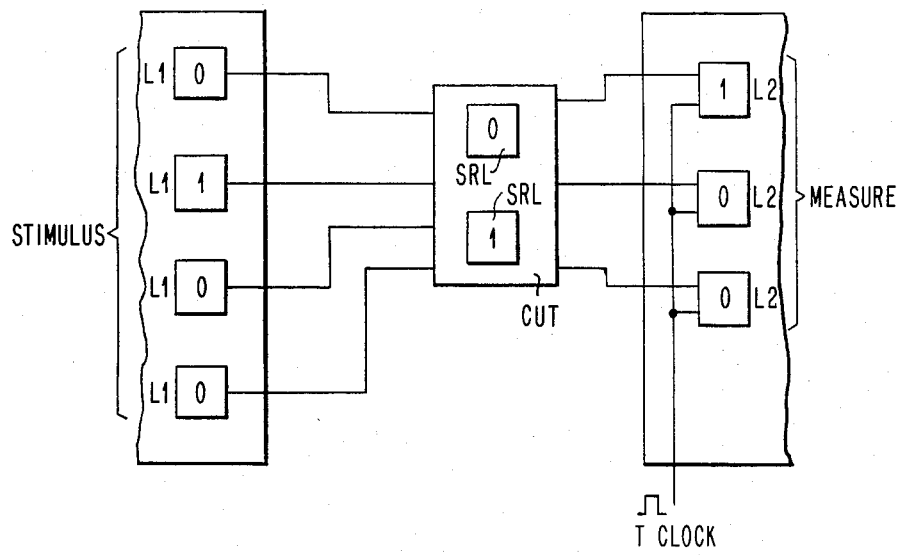
FIG. 36 depicts a migration stand-alone CUT test where the test stimuli after applying the initial values to the CUT inputs and shift register latches includes pulsing of one or more system clocks, A or B clocks.

The stand-alone CUT tests can be readily migrated to the package if the tests are constrained in the manner described below:
(a) The test stimuli consist of initial values applied to the shift register latches and inputs of the CUT and the test responses consist of measuring the outputs of the CUT—as in FIG. 35; or
(b) The test stimuli after applying initial values to the CUT inputs and shift register latches includes pulsing of one or more of system clocks, A or B clocks. The test responses are obtained by a subsequent shift register unload but no earlier measurement of CUT outputs—as in FIG. 36.

Figure 37:
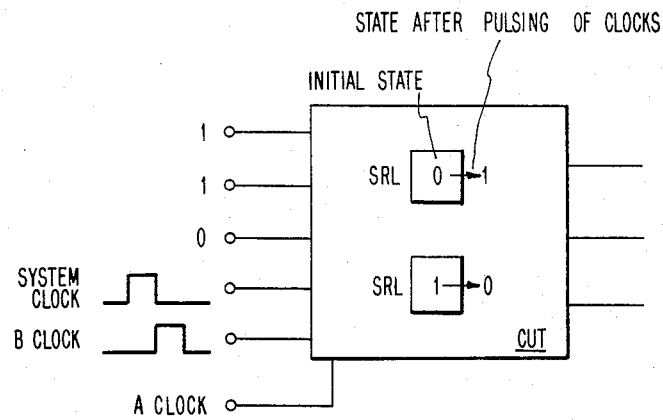
FIG. 37 depicts the accomplishment of a migration type (a) test to the CUT as in FIG. 35.

The migration of the (a) type of test to the package is accomplished as depicted in FIG. 37 by (i) initial shift register load to set the values of the CUT internal shift register latches and the external (to CUT) shift register latches that uniquely control the CUT inputs when the neighboring chips on the package are in test mode, (ii) setting all the neighboring chips of the CUT in test mode, (iii) pulsing the T-clock to capture the CUT output responses in corresponding unique shift register latches, (iv) resetting all neighboring chips to normal mode, and (v) unloading the shift register to indirectly measure the CUT output response.

Figure 38:
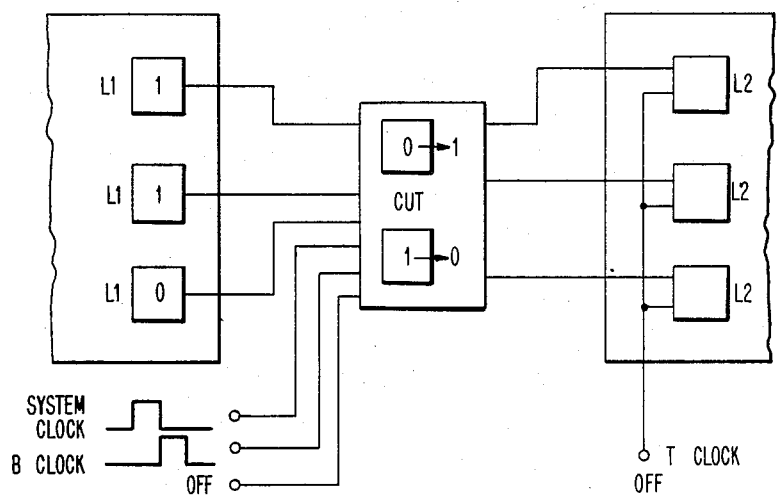
FIG. 38 depicts the accomplishment of a migration type (b) test to the CUT as in FIG. 36.
Figure 39:
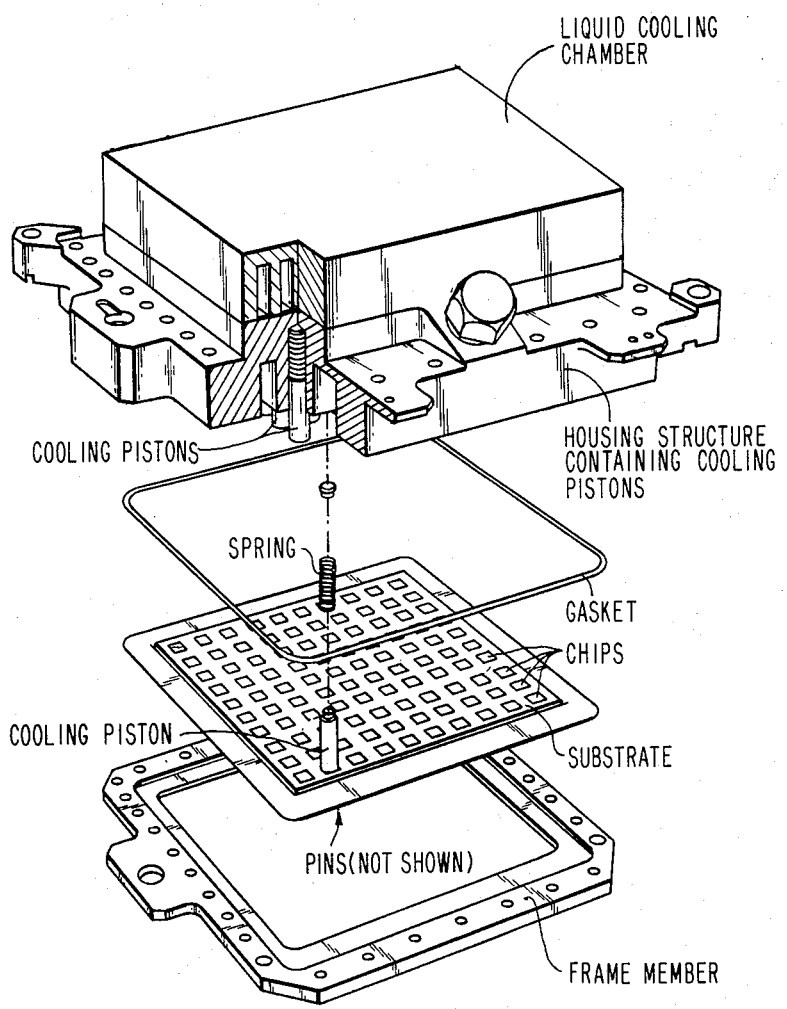
FIGS. 39 and 40 are to be viewed together.
Figure 40:
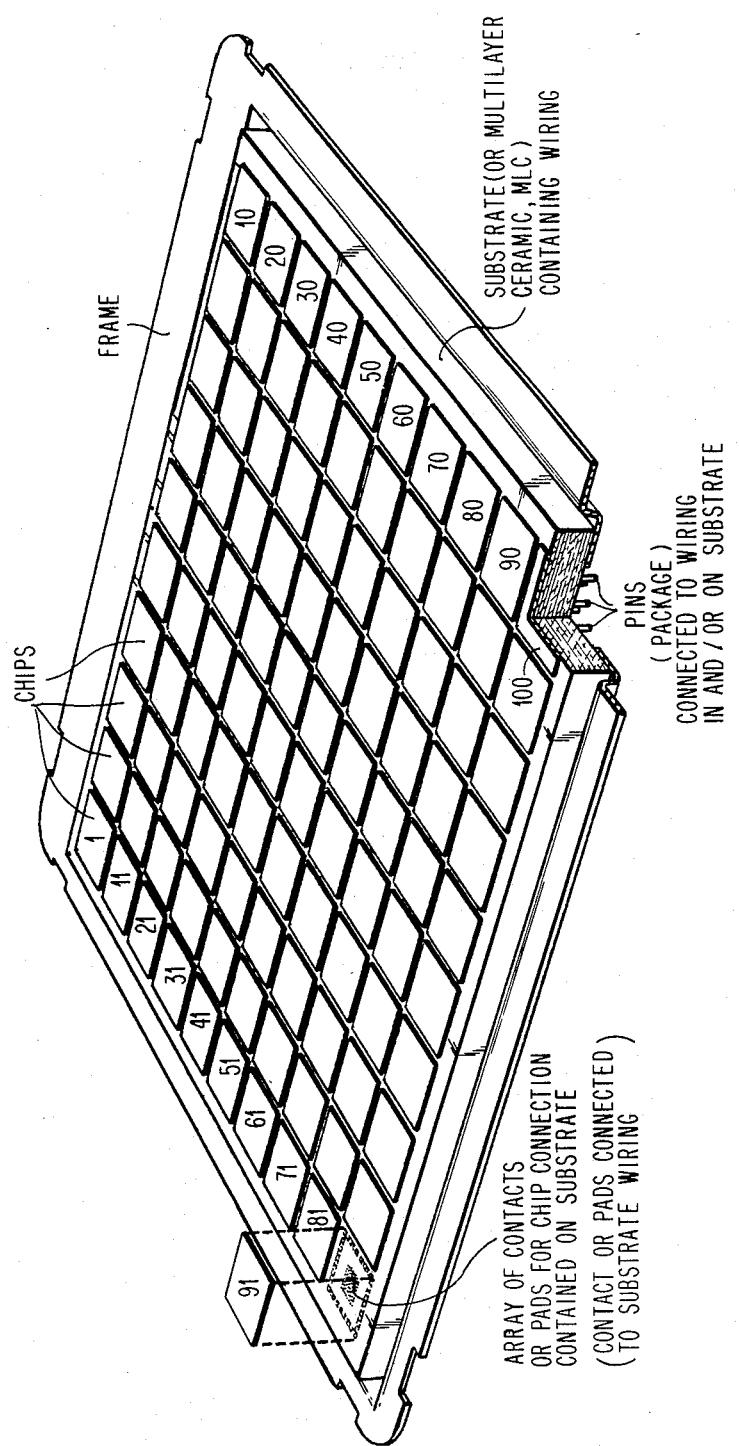

The migration of the (b) type test to the package is accomplished as depicted in FIG. 38 by (i) initial shift register load as for (a) type test, (ii) setting all the neighboring chips of the CUT in test mode, (iii) pulsing the package pins that control the corresponding system, A or B clocks in the same order as in test (a), (iv) resetting all neighboring chips to normal mode, and (v) unloading the shift register to indirectly measure the CUT internal shift register latch states.

While this invention has been particularly described with reference to the preferred embodiments thereof, it will be understood by those skilled in the art that the foregoing and other changes in form and details may be made therein without departing from the spirit and scope of the invention.

We claim:
1. A method for performing an electrical test of a packaging structure containing n interconnected integrated circuit chips, said method being accomplished while said n interconnected chips remain interconnected and without the use of a mechanical probe structure, each of said n integrated circuit chips including test circuit means, said test circuit means including scan-in scan-out circuit means, said scan-in scan-out circuit means of each of said n interconnected integrated circuit chips including shift register latch circuit means, said test circuit means of each of said n integrated circuit chips further including control circuit means, said control circuit means cooperating with said scan-in scan-out circuit means of each of said n interconnected integrated circuit chips, said control circuit means being controllable to place all but any selected one of said n interconnected integrated circuit chips in a "test" mode, said selected one of said n interconnected integrated circuit chips being a chip under test, said packaging structures and said method being characterized in that electrical contact to said packaging structure and each of said n interconnected integrated circuit chips is only provided through a plurality of accessible packaging contacts, said packaging structure including wiring for interconnecting said n interconnected integrated circuit chips one with another and said accessible packaging contacts, said wiring of said packaging structure including wiring for connecting said scan-in scan-out circuit means of said test circuit means of each of said n integrated circuit chips into a single packaging structure scan-in scan-out circuit means, said method including in the order recited the following steps:

(a) electrically contacting only said plurality of accessible packaging contacts determine the electrical integrity of the packaging structure scan-in scan-out circuit means wherein the term electrical integrity is defined as determining whether or not said packaging structure scan-in scan-out circuit means is electrically defective;

(b) electrically contacting only said plurality of accessible packaging contacts determine the electrical integrity of said packaging structure wiring wherein the term electrical integrity is defined as determining whether or not said packaging structure wiring is electrically defective; and (c) electrically contacting only said plurality of accessible packaging contacts determine the electrical integrity of any selected one of said n interconnected integrated circuit chips, wherein step (c) of said method includes the following sub-steps in the order recited, (1) placing a binary value in said packaging structure scan-in scan-out circuit means, (2) placing each chip of said n interconnected integrated circuit chips, except said any selected one of said n integrated circuit chips, in a "test mode", whereby said selected one of said n inteconnected integrated cuircut chips is a "chip under test (CUT)", (3) employing at least the binary value placed in said packaging structure scan-in scan-out circuit means impress a bianry value on the integrated circuit chip under test, and (4) employing at least the packaging structure scan-in scan-out circuit means obtain and examine a binary output from said chip under test to determine the electrical integrity of said chip under test, wherein the term electrical integrity is defined as determining whether or not said integrated circuit chip under test is electrically defective.

2. A method for performing an electrical test of a packaging structure containing n interconnected integrated circuit chips, said method being accomplished while said n interconnected chips remain interconnected and without the use of a mechanical probe structure, each of said n integrated circuit chips including test circuit means, said test circuit means including scan-in scan-out circuit means, said scan-in scan-out circuit means of each of said n interconnected integrated circuit chips including shift register latch circuit means, said test circuit means of each of said n integrated circuit chips further including control circuit means, said control circuit means cooperating with said scan-in scan-out circuit means of each of said n interconnected integrated circuit chips, said control circuit means being controllable to place all but any selected one of said n integrated circuit chips in a "test" mode, said selected one of said n integrated circuit chips being a chip under test, said packaging structure and said method being characterized in that electrical contact to said packaging structure and each of said n interconnected integrated circuit chips is only provided through a plurality of accessible packaging contacts, said packaging structure including wiring for interconnecting said n interconnected integrated circuit chips one with another and said accessible packaging contacts, said wiring of said packaging structure including wiring for connecting said scan-in scan-out circuit means of said test circuit means of each of said n integrated circuit chips into a single packaging structure scan-in scan-out circuit means, said method, as recited in claim 1, wherein step (a) includes the following sub-steps (1) perform a "flush test" of the packaging structure scan-in scan-out circuit means, and (2) perform a "shift test" of the packaging structure scan-in scan-out circuit means.

* * * * *